United States Patent
Ryckaert et al.

(10) Patent No.: US 7,719,373 B2
(45) Date of Patent: May 18, 2010

(54) DEVICE AND METHOD FOR GENERATING A SIGNAL WITH PREDEFINED TRANSCIENT AT START-UP

(75) Inventors: Julien Ryckaert, Tervuren (BE); Jan Craninckx, Boutersem (BE)

(73) Assignee: IMEC, Leuven (BE)

( * ) Notice: Subject to any disclaimer, the term of this patent is extended or adjusted under 35 U.S.C. 154(b) by 18 days.

(21) Appl. No.: 11/976,776

(22) Filed: Oct. 29, 2007

(65) Prior Publication Data

US 2008/0111639 A1    May 15, 2008

Related U.S. Application Data

(60) Provisional application No. 60/863,174, filed on Oct. 27, 2006.

(30) Foreign Application Priority Data

Apr. 23, 2007    (EP) .................................. 07106731

(51) Int. Cl.
| H03B 5/24 | (2006.01) |
| H03C 3/00 | (2006.01) |
| H03K 3/03 | (2006.01) |
| H03L 7/085 | (2006.01) |
| H03L 7/099 | (2006.01) |

(52) U.S. Cl. ...................... 331/173; 331/17; 331/34; 331/36 C; 331/57; 332/103; 375/376

(58) Field of Classification Search ............... 331/1 A, 331/14, 16–18, 25, 57, 172, 173, 34, 36 C, 331/179; 332/103–105; 360/51; 375/376; 455/258–260

See application file for complete search history.

(56) References Cited

U.S. PATENT DOCUMENTS

| 4,122,501 | A | * | 10/1978 | Sordello et al. | ............... 360/51 |
| 4,533,881 | A | * | 8/1985 | Monett | .................... 331/36 C |
| 4,727,339 | A | * | 2/1988 | Doty et al. | .................. 331/173 |
| 5,136,260 | A | | 8/1992 | Yousefi-Elezei | |
| 5,285,483 | A | * | 2/1994 | Ogawa et al. | ............... 375/376 |
| 6,252,467 | B1 | | 6/2001 | Yoshimura | |
| 7,132,903 | B1 | | 11/2006 | Johnson et al. | |
| 2005/0281320 | A1 | * | 12/2005 | Neugebauer | ................ 375/141 |
| 2006/0244543 | A1 | | 11/2006 | Meltzer | |

FOREIGN PATENT DOCUMENTS

| EP | 0601780 A2 | 6/1994 |
| WO | 2006094985 A1 | 9/2006 |

OTHER PUBLICATIONS

Partial European Search Report in EP 07 10 6731.

* cited by examiner

*Primary Examiner*—David Mis
(74) *Attorney, Agent, or Firm*—McDonnell Boehnen Hulbert & Berghoff LLP

(57) ABSTRACT

A device and a method are presented for generating an intermitted oscillating signal comprising a plurality of oscillating portions separated from each other in time. The device and method are suited for communication systems, in particular for Ultra-Wide Bandwidth (UWB) applications. The device comprises a variable oscillator for generating the oscillating portions; switching circuitry for switching on/switching off the variable oscillator at the beginning/end of each oscillating portion; and circuitry for setting initial conditions in the variable oscillator to impose a predefined transient and a characterizing frequency upon each start-up.

17 Claims, 21 Drawing Sheets

DEVICE AND METHOD FOR GENERATING A SIGNAL WITH PREDEFINED TRANSCIENT AT START-UP

The present application claims the priority of U.S. Provisional Patent Application No. 60/863,174, filed Oct. 27, 2006, and of European patent application EP 07106731.8, filed Apr. 23, 2007.

BACKGROUND

The present disclosure relates to a device and a method for generating an intermitted signal at least part of which is an oscillation signal with a characterising frequency and a constant phase at start-up, suited for communication systems, in particular for Ultra-Wide Bandwidth (UWB) applications.

Devices designed to generate signals with a controlled frequency are commonly used in a variety of applications. Typical examples are radio transmitters, transmitters and receivers in telecommunications, computer devices and other electronic applications where it is desired to stabilize a generated signal or to detect signals in the presence of noise.

Traditionally, the controlled frequency is implemented by a phase locked loop (PLL). This is a closed-loop feedback control system that generates and outputs a signal in relation to the frequency and phase of a reference signal. The PLL comprises of a phase detector, a variable oscillator, and a feedback loop. The circuit reacts to both the frequency and the phase, automatically raising or lowering the frequency of the variable oscillator until there is a match with both the frequency and the phase of the reference signal.

A disadvantage of this technique is the large start-up time for both phase and frequency compensation, demanding significant power. This is not well suited for many battery-operated, portable and hand held device applications. A second drawback of this approach is the accumulative jitter process typically initiated by the voltage controlled oscillator (VCO) (in series with jittery circuitry).

Another idea is presented in European Publication EP-A 0601780. A technique is described for a programmable frequency generator. The frequency is established in a ring oscillator. This is done by a set of transistors that supply an operating current to the ring. The device can be turned off to reduce the power supply. The tuning in phase and frequency is solely done by adapting the frequency. This approach results in a reduced accuracy and slows down the process.

It is an aim of the present disclosure to provide a device and a method for generating an intermitted signal with a characterising frequency in a very fast, accurate way consuming little power.

This aim is believed to be achieved with the use of devices and methods as described herein.

SUMMARY

A device is presented for generating an intermitted oscillating signal comprising a plurality of oscillating portions separated from each other in time. The device comprises a variable oscillator for generating the oscillating portions, circuitry for switching on/switching off this oscillator at the beginning/end of each oscillating portion, and circuitry for setting initial conditions in the variable oscillator. The predefined transient and a characterizing frequency upon each start-up are ensured by imposing initial settings on the variable oscillator. As a consequence, the phase of the generated signal will be constant at start-up and only the frequency needs to be controlled. The information is coded in the phase, so keeping the phase constant is important. The intermitted signal with a controlled frequency and constant phase can be generated very quickly and accurately. The device is switched off between consecutive oscillating portions by, for example, an enabling node in the variable oscillator. Therefore, the activity mode of the device can be reduced and, as a consequence, also the power consumption. The device combines also the advantages of no jitter and scalability.

An intermitted signal as referred to herein is a signal comprising a part holding information (as in a burst) and a part wherein activity is temporarily suspended.

The generated intermitted signal is preferably a UWB signal. A UWB signal as referred to herein is, according to FCC regulations, a signal having a bandwidth of at least 20% of the centre frequency or at least 500 MHz and a centre frequency between 3 and 10 GHz. The 5-6 GHz band may be excluded in practice, since it is taken up by WLAN communication.

A device according to the present disclosure is preferably designed for the mandatory mode. In this mode, the burst duration equals 32 ns and the frame or symbol duration equals 1.024 μs. The signal duty is 1/32. The design is made such that this duty cycle is exploited to reduce the static power consumption. Therefore it is possible to switch all circuits off between the transmission of two consecutive bursts. In another exemplary embodiment, a design is presented supporting other modes with other pulse durations. Various pulse durations are defined in the standard and are referred to as the "short pulses". In this embodiment, the predefined start-up is programmable; the pulse duration is defined by the standard, while the shape and the amplitude of the pulse can be programmed according to the user requirements.

In a preferred embodiment, the initial condition setting circuitry comprises nodes in between at least two cascaded stages of the variable oscillator. Furthermore, the nodes may be voltage nodes and the initial setting circuitry may comprise switches between ground and supply voltage on those voltage nodes. Fast and uniform start-up is achieved by setting the nodes at a predefined state.

In a preferred embodiment, the device further comprises feedback circuitry for monitoring the characterizing frequency of the oscillating portions. In an embodiment, the feedback circuitry comprises a detection circuitry, which compares the characterising frequency to that of a reference and inputs a result indicative of this comparison into storage circuitry associated with the variable oscillator. Dependent on this result, the frequency of the generated output signal is adapted. Only the frequency and not the phase of the generated signal needs to be adapted. This action is performed very quickly and accurately. A device as described herein preferably offers the possibility to shut down and to start up at run-time, whereby the required correlation between two consecutive bursts is remained.

In another embodiment, the device further comprises dividing circuitry for dividing the frequency of the oscillating portions at least once to a frequency roughly matching a preset frequency. The frequency may be divided twice. The frequency is preferably divided by an integer value to produce the preferred chip rate and maybe further by a fixed value. In this embodiment, the detection circuitry is provided for comparing the divided frequency to that of a reference and for inputting a result indicative of this comparison into storage circuitry associated with the variable oscillator.

In another embodiment, the device further comprises a modulator providing up-conversion of the oscillating portions to a carrier signal. For the design supporting the "short pulses", the amplitude and the shape of the outgoing signal can be designed according to the user requirements. In another embodiment, the device may further comprise a modulator producing preferably a BPSK modulated signal on the basis of the up-converted signal. To produce a burst of BPSK modulated chips, the carrier signal must be modulated by a code sequence of +1 and −1. The inverting operation is realized in discrete steps. The discrete steps are consecutively activated by properly chosen phases provided by the divider chain.

A device as described herein can, for example, be incorporated in a telecommunications device, such as a transmitter, a receiver, a transceiver, an Ultra-Wide Bandwidth telecom device or any other telecom device known to the person skilled in the art.

A method is described herein for generating an intermitted oscillating signal comprising a plurality of oscillating portions separated from each other in time. The method comprises the steps of: a) switching on a variable oscillator at the beginning of each the oscillating portions; b) upon start-up, imposing initial conditions on the variable oscillator determining a predefined transient and characterizing frequency; c) switching off the variable oscillator at the end of each of the oscillating portions. This method can generate very fast an accurate signal. Again, the activity mode of the device can be reduced and, as a consequence, also the power consumption. It preferably demonstrates the advantages of no jitter and of scalability. Starting and stopping the variable oscillator is preferably arranged by an enabling node.

The generated intermitted signal is preferably an UWB signal. The design is made such that the duty cycle is exploited to reduce the static power consumption. Therefore it is possible to switch all circuits off between the transmission of two consecutive bursts.

The method preferably also comprises the step of reading out a stored characterising frequency simultaneously with step b. This frequency can be proposed at start-up to have an indication of the preferred frequency of the generated signal.

In an embodiment, the step of imposing initial conditions comprises applying conditions to nodes in between at least two cascaded stages of the variable oscillator to guarantee a constant phase at start-up. In another embodiment, the step of imposing initial conditions preferably comprises switching the nodes between ground and supply voltage. Alternatively, the constant phase can also be ensured by checking the signal at the outcome of the cascaded stages and by deciding at this point if the phase needs to be rotated or not.

Further, the method preferably comprises the step of monitoring the characterizing frequency of the oscillating portions by means of feedback circuitry. In a preferred embodiment, this step of monitoring comprises the step of comparing the frequency of the oscillating portions to that of a reference and inputting a result indicative of this comparison into storage circuitry associated with the variable oscillator. In between two consecutive bursts, an error in the frequency can be generated. The feedback circuitry controls this error and adapts the frequency when necessary.

In another embodiment, the method further comprises the step of dividing the frequency of the oscillating portions at least once to a frequency roughly matching a preset frequency. The frequency is preferably divided by an integer value to produce the preferred chip rate and may be further divided by a fixed value.

In an alternative embodiment, the method comprises the step of modulating the intermitted oscillating signal to a BPSK modulated signal in discrete phases, the phases being provided by the dividing circuitry.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
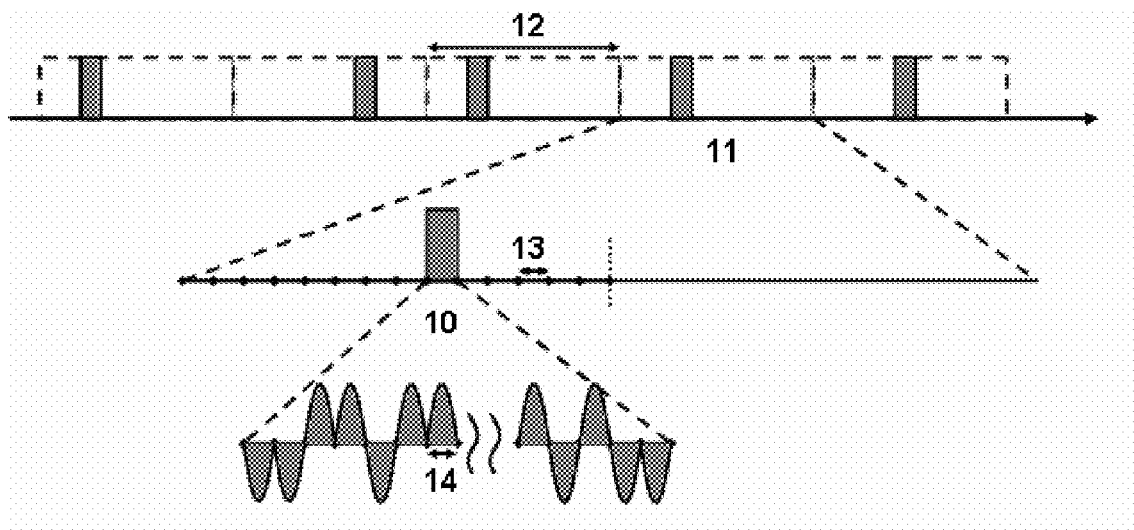
FIG. 1 shows a structure of a payload sequence.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

The following detailed description relates to a device for generating an output signal at least part of which is an oscillation signal with a characterising frequency and with a predefined transient at start-up. The device can be used to produce very fast a very accurate variable frequency system clock.

Large start-up time is reduced by using a so-called phase-aligned frequency locked loop. The phase alignment is done by forcing a uniform start-up of the variable oscillator when switching the device on. For example, for Ultra-Wide Bandwidth (UWB) communications (range from 3 to 10 GHz), the maximum settling time of the variable oscillator, preferably a digitally controlled oscillator (DCO), is below 2 ns to achieve 4 MHz accuracy (to keep the signal-to-noise (SNR) degradation below 1 dB over the burst of the signal). Summarised, the tuning process takes less than 2 ns and attains a 0.04% to 0.1% tolerance for signals with a frequency range going from 3 to 10 GHz (compared with prior art: 150 µs to attain 0.5% to 4% for signals between 400 kHz to 100 MHz).

The air interface of the UWB part of the 802.15.4a standard is subdivided into two different signal formats, one for the preamble data and the other for the payload data. The preamble sequence is composed of a stream of individual pulses coded in three levels: +1, 0 and −1. The preamble sequence format is similar to the traditional impulse radio format. However, in the payload sequence shown in FIG. 1, one symbol is composed of a stream of Nc consecutive chips hereafter called a burst (10). A burst (10) is present within a fixed time frame (11) of duration T_frame (12) and at given position determined by a predefined code. Therefore, the time frame (11) is subdivided into a number of time slots of fixed duration T_slot (13).

The air interface is divided in several different modes. An overview of the different modes can be found in the 15.4a draft standard. All these are mainly defined by variations of the number of chips per burst and the number of slots per frame. There is one constant value for all the modes, that is the chip duration which is equal to 2 ns (=1/499.2 MHz). An important property of the standard is that all other time durations such as the slot duration (13) and the frame duration (12) are integer multiples of this T_chip value (14) such that a single frequency reference can be used to produce all the different timings.

For the mandatory mode, the number of chips per burst is 16. The number of slots per frame is 16×2. In this mode, the burst duration equals 32 ns and the frame or symbol duration equals 1.024 µs. The signal duty is 1/32. The design is made such that this duty cycle is exploited to reduce the static power consumption.

Figure 2:
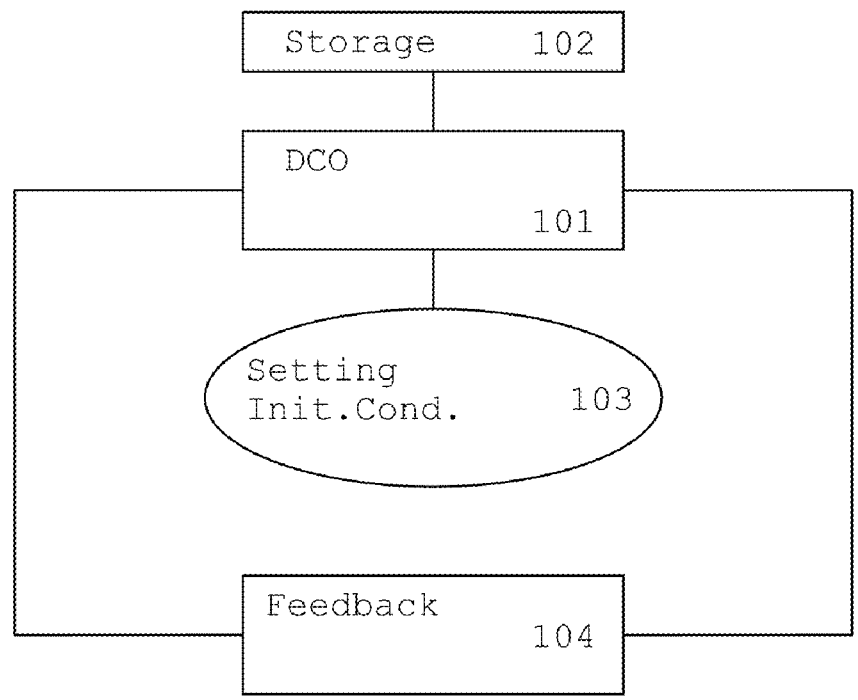
FIG. 2 shows a block diagram of a signal generating device.

A schematic block diagram of a signal generating system is shown in FIG. 2. It comprises a variable oscillator (101) and circuitry for setting (103) initial conditions in order to impose a predefined transient at start-up. The variable oscillator is preferably a digitally controlled oscillator (DCO), but can be any oscillator known to the person skilled in the art, like for example a voltage controlled oscillator (VCO). The DCO (101) may further comprise storage circuitry (102). The frequency of the generated signal is controlled by feedback circuitry (104).

Figure 3:
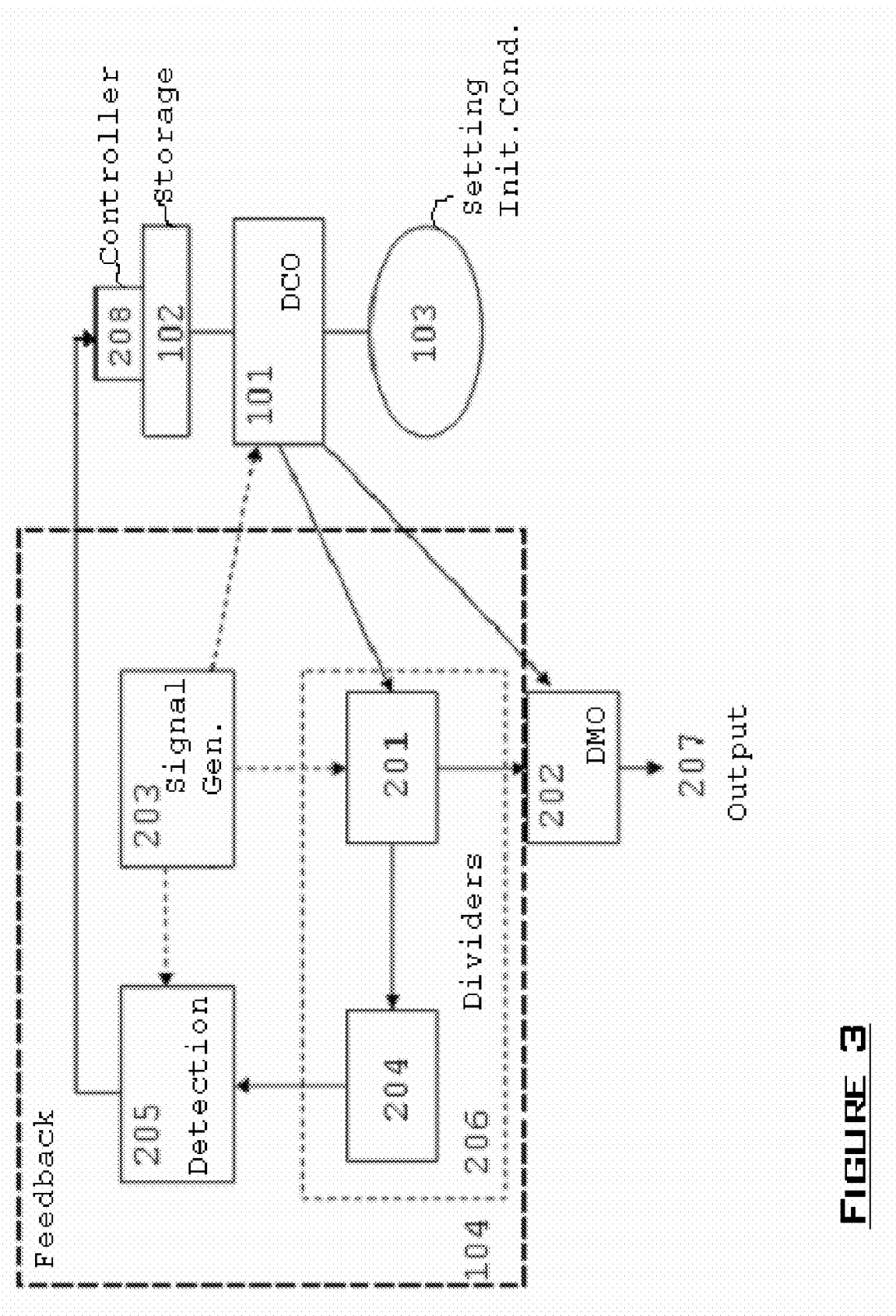
FIG. 3 shows a more detailed block diagram of a signal generating device.

A more detailed block diagram is shown in FIG. 3. The device can be understood with reference to the next building blocks: a DCO (101) with storage (102) and a feedback loop (104) comprising a block with dividers (206) and detection circuitry (205). The inputs are provided by a signal generator (203) for programming some reference signals for the DCO (101) as well as the detection circuitry (205) and also one of the dividers (201).

The device can be used for example as stand-alone integrated circuit chip. The device can produce an RF carrier for all bands between 3 and 10 GHz. Additionally the output signal can be modulated by a modulator, preferably a digital modulator (DMO) (202) to create for example Binary Phase-shift Keying (BPSK) (207) symbols at a certain rate (preferably the chip rate which equals to 499.2 MHz). Any other modulation scheme known to the person skilled in the art can also be used, such as QPSK, among others.

Figure 4:
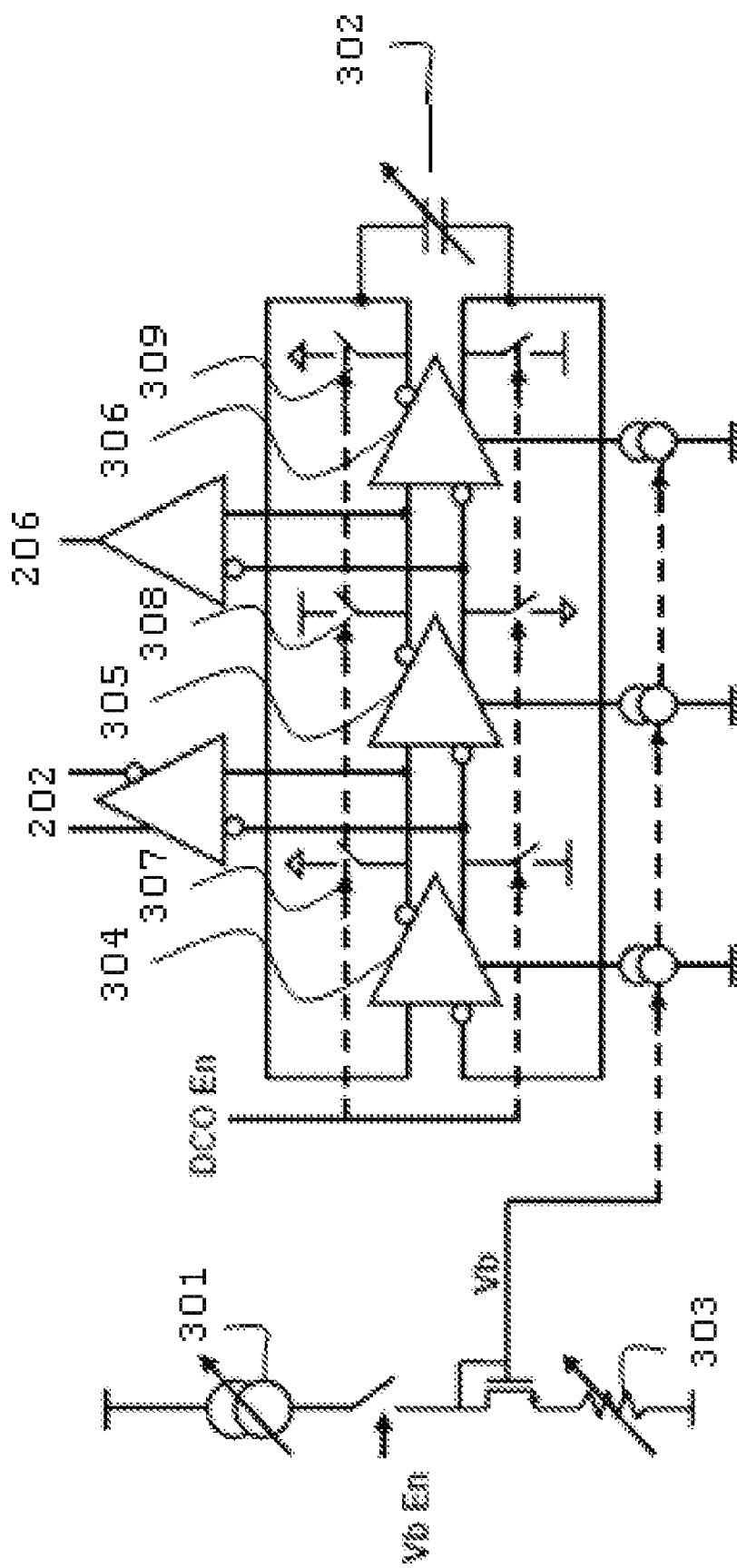
FIG. 4 shows a circuit diagram of a DCO.

The DCO can be, for example, a ring oscillator (RO) as illustrated in FIG. 4. Such an oscillator may have three differential stages (304, 305, 306). It reaches high frequencies and has a very large tuning range with sufficient oscillation instability margin. The RO can cover a wide frequency range (for example for UWB from 3 to 10 GHz).

Because of the wide range, together with a fine frequency accuracy specification, the tuning should be done with three different methods. Implementing the full tuning range with a switchable biasing current would entail matching with large transistors for the smallest frequency steps whose capacitances would unbearably slow down the start-up of the circuit. Therefore, a 6-bit current source (301) is used only for coarse tuning, such as to benefit from its power scalability. The medium tuning, a 5-bit capacitor bank (302) is used since it does not degrade start-up time. However, the 5-bit capacitor bank is limited in the minimum frequency steps by parasitic capacitances. Therefore, the finest tuning is implemented with an 8-bit tuning (303) on the degeneration resistor of the biasing current mirror. A 4-bit binary has been used to ensure a monotonous frequency tuning curve.

In conclusion, although thirteen bits would ideally be sufficient to cover the full band, the necessary overlap (overlap between adjacent ones to ensure continuity in the frequency sweep) between the various frequency tunings lead to nineteen bits tuning. Summarized, three means of tuning have been used in a preferred embodiment:

A coarse tuning based on changing the bias current in the differential pairs;

A medium tuning based on adding capacitances on the nodes; and

A fine tuning based on changing the degeneration resistance of the DCO biasing current mirror in small steps.

As the divider (201) has a heavy input buffer, a cascade of inverters (304, 305, 306) has been implemented to drive the buffer. The capacitances bank is attached also to one of the differential node. Additional switches (307, 308, 309) at each of the outputs of the ring oscillator are placed alternatively versus ground and supply to impose an initial state when the ring is started. Fast and uniform start-up of the DCO (101) is achieved by setting the ring oscillator nodes at a predefined state and releasing them at a reference clock edge.

The frequency divider (201) divides the DCO frequency by an integer value from 7 to 20 to produce the chip rate. The fully dynamic divider is realized in True Single-Phase Clock (TSPC) logic based on J. Yuan and C. Svensson ("Fast CMOS nonbinary divider and counter", IEE Electronic Letters, Vol. 29, Issue 13, p. 1222-1223, June 1993), which is hereby incorporated by reference in its entirety. The divider comprises of a cascade of 18 half-transparent latches (401) (a latch is presented in FIG. 5) in a loop closed by a pre-charge unit and clocked by the high frequency signal to be divided.

Figure 5:
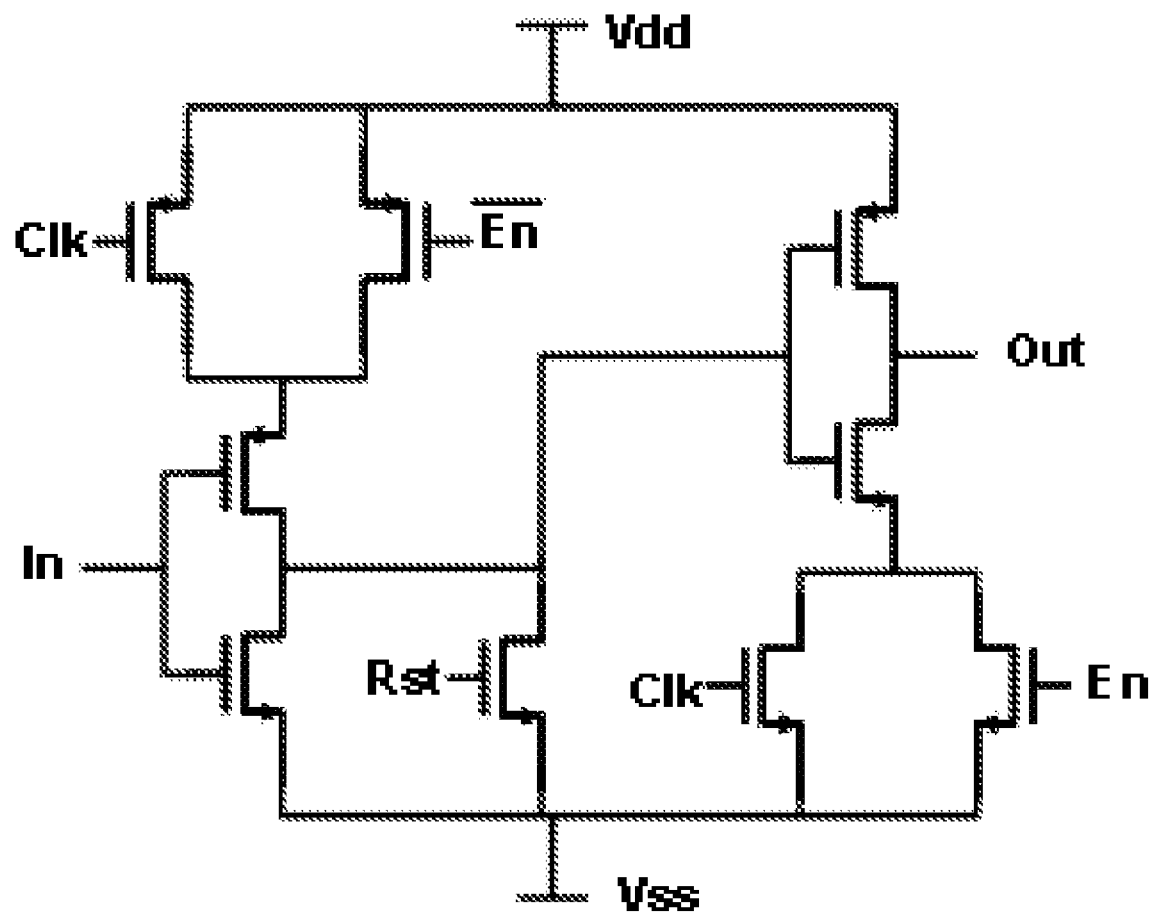
FIG. 5 shows a circuit diagram of a half transparent latch.

A circuit diagram of such a latch is shown in FIG. 5. The divider (201) must divide the RF frequency by an integer value ranging from seven (for the 7*499.2 MHZ RF LO) to twenty (for the 20*499.2 MHz LO). The output of the divider should be 499.2 MHz (=chip rate).

Figure 6:
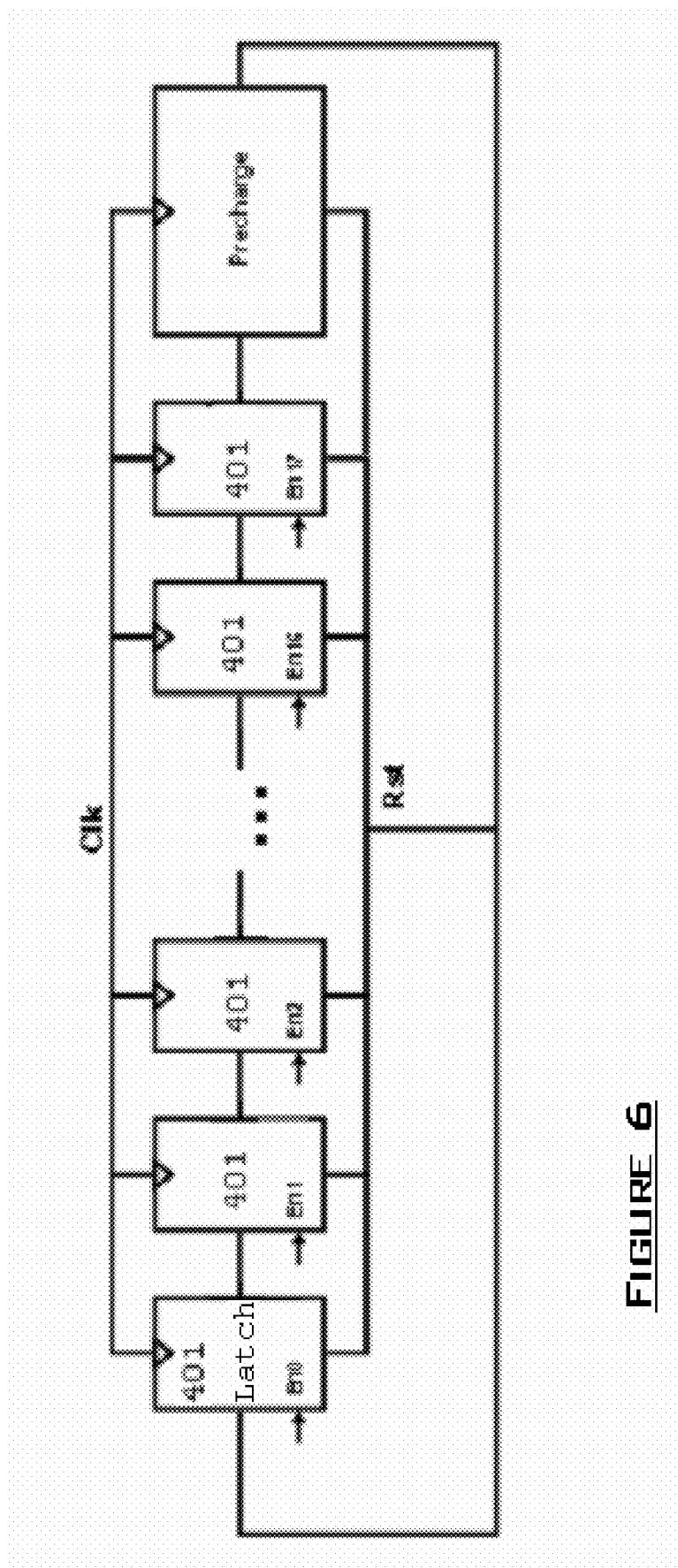
FIG. 6 shows a circuit diagram of a programmable divider.

The circuit is in its transparent state when In=Out=1 and the intermediate node to 0. Indeed, for a rising edge transition at the input, the circuit appears just as a cascade of two inverters. At a falling edge, the intermediate node changes state only when Clk is low and the value is stored since the second stage inverter has its pull down path open. When clock changes to value one, the pull down of the second stage is released and the transition is passed to the output. The En (Enable) input converts the circuit to a fully transparent cascade of two inverters such as to disable the latching operation. A reset (Rst) input is added to force the intermediate node back to the transparent state. Using this simple structure, a programmable divider can be realized, as illustrated in FIG. 6.

Figure 7:
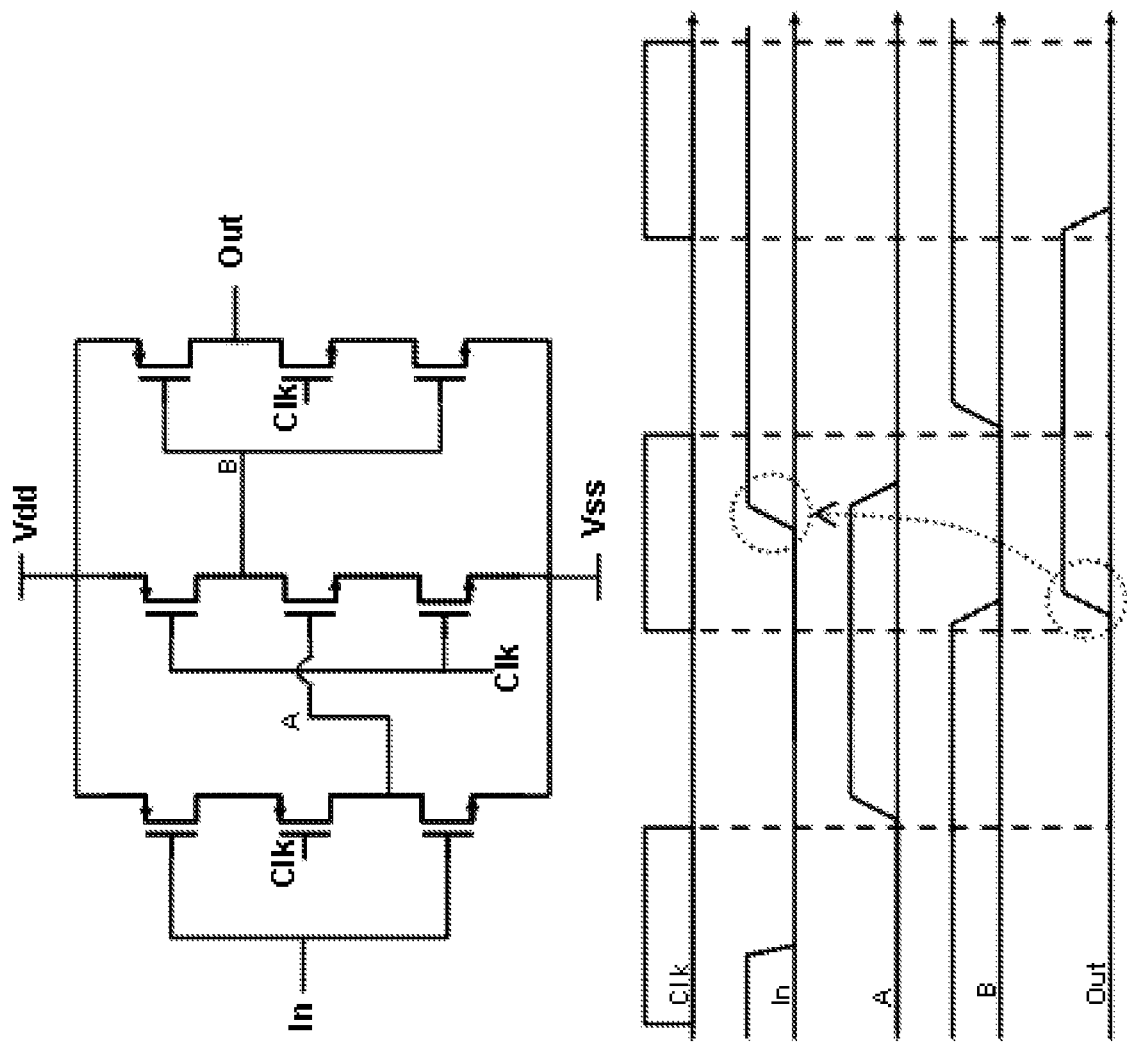
FIG. 7 shows a circuit diagram of a pre-charge circuit and a graph of a reaction of the pre-charge circuit.

Assuming that all of the latches are enabled and are set to their transparent states, a falling edge at the pre-charge circuit output will transit from an HT latch to the following at every cycle of the clock. It will thereby arrive at the pre-charge circuit input after eighteen clock cycles. The pre-charge circuit then resets all the latches back to the transparent state and creates a new falling edge. This last operation takes two clock cycles. Thereby, a cycle of the system corresponds in total to twenty clock cycles and the system acts as a divider by 20. If an HT latch is disabled, the HT latch passes the falling edge directly and the divider divides by 19. Division values of twenty down to seven can then be obtained by disabling the necessary number of latches. A circuit diagram of the pre-charge circuit is shown on FIG. 7. A plot describing the principle is also shown. The rising edge is transparent to all latches and propagates back to the input.

Figure 8:
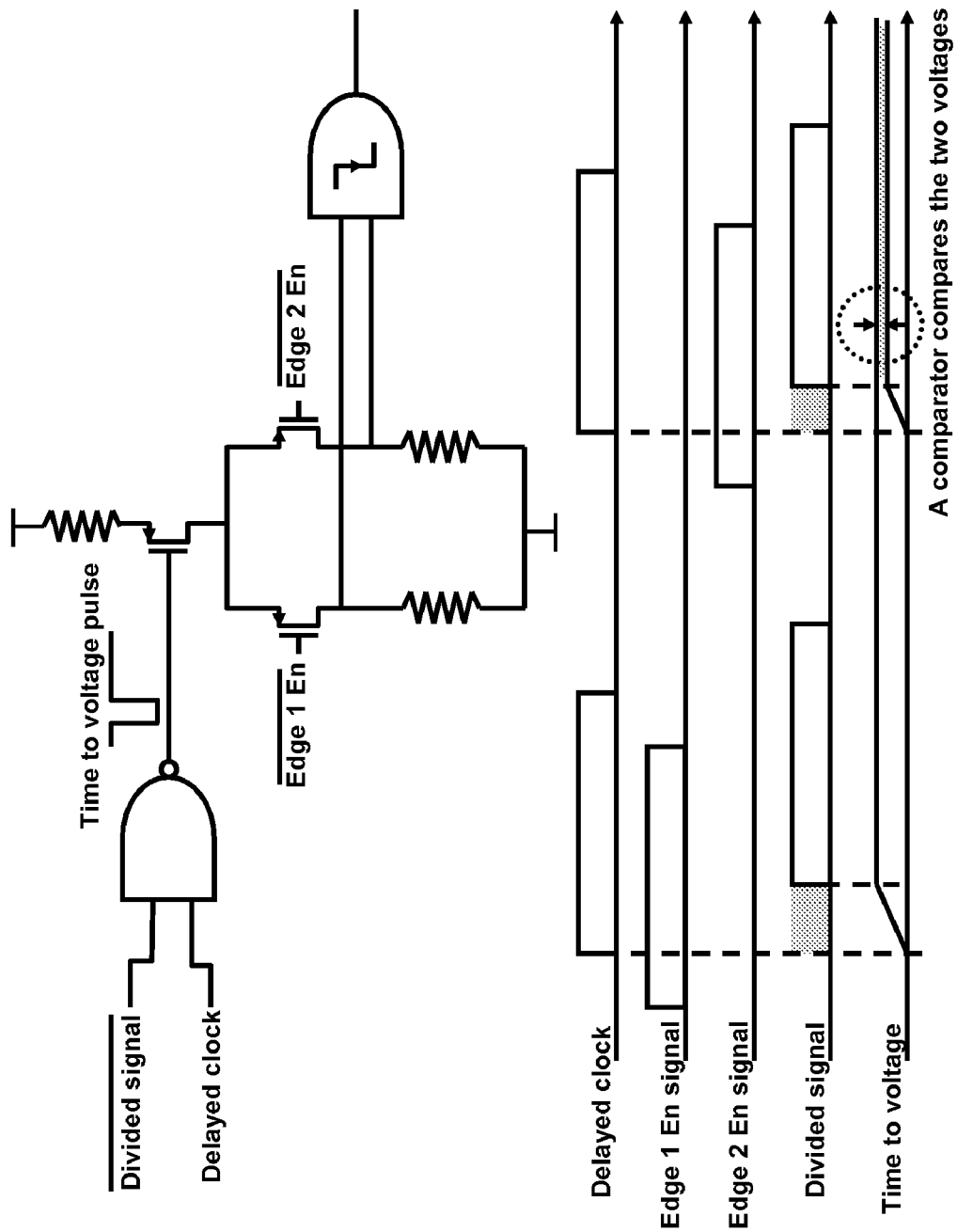
FIG. 8 shows a circuit diagram of an early-late detector circuit and a timing chart of typical signals.

Preferably, the detection circuitry (205) comprises an early-late detector. The early-late detector (FIG. 8) measures the time difference between the rising edge of the RF LO divided output and the reference clock. The difference between two consecutive measurements produces a 1-bit value specifying whether the RF LO is too high or too low. This result is then used to update the DCO frequency setting for example by a controller (208) associated with the DCO. Three binary search calibration steps are done to set respectively the coarse, the medium, and the fine tuning word, after which the DCO frequency is less than 4 MHz of the desired frequency. Drift of the DCO frequency during operation is monitored by the ELD status after every transmitted burst, and the DCO control (208) is adjusted if necessary for the next burst.

The early-late detector compares the clock to a divided output of the DCO. The output is first divide by the high speed divider, than divided by a fixed value of 16. The block diagram of the early-late detector is shown on FIG. 8.

The modulator (202) creates a burst by modulating the RF carrier. The burst consists of sixteen chips of 2.0243 ns modulated in BPSK. The waveform of each chip is specified according to a cross-correlation rule. According to that definition, a triangular waveform of the chip duration can be used such that the modulator only needs to invert the carrier when the code transits from a −/+1 to a +/−1. The inverting operation is realized in discrete steps such as shown on FIG. 9.

The sampling signals for the four steps are provided by the divider. The signal output of each of the HT latches is a 499.2 MHz signal with a falling edge delayed either by 2.0243 ns/N if the latch is enabled or by two inverter delays if the latch is fully transparent where N is the division value (seven-twenty). By taking four different appropriate outputs of the divider and by carefully choosing the disabled latches, four more or less regular falling edges can be obtained as sampling instants. This operation is shown in the diagram of FIG. 10.

Figure 10:
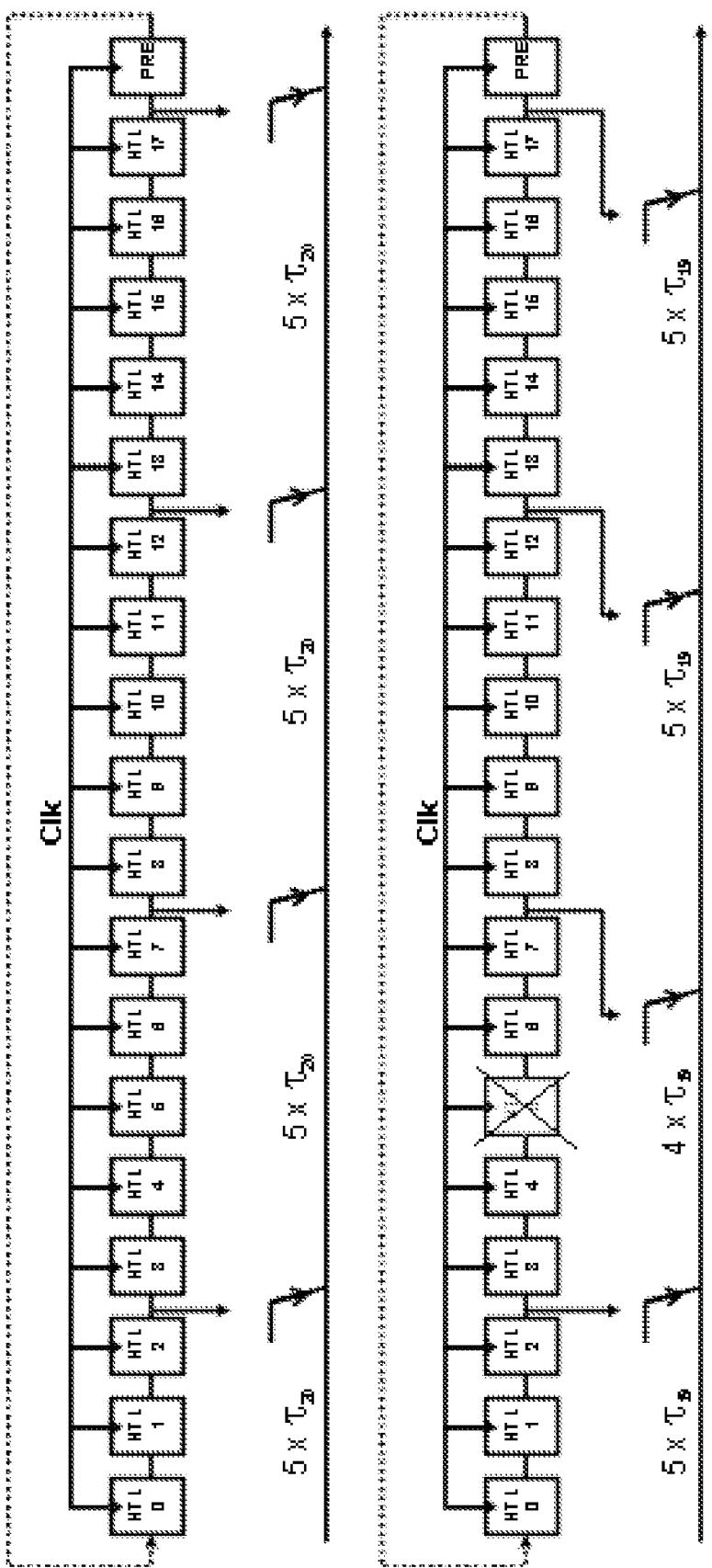
FIG. 10 shows a circuit diagram of sampling instants for a division.

FIG. 10 shows the example of a division by 20 as compared to a division by 19. In the divide by 20 example, the four time intervals defined by the four outputs are regularly spaced such that the duration of each segment is substantially 2.0243 ns/4. If one latch is disabled for the division by 19, the segment of the disabled latch has a unit less than the other segments, resulting in three segments of regular spacing of 2.0243 ns/19*5 and one segment of 2.0243 ns/19*4. The same reasoning can be done for further division values.

Figure 11:
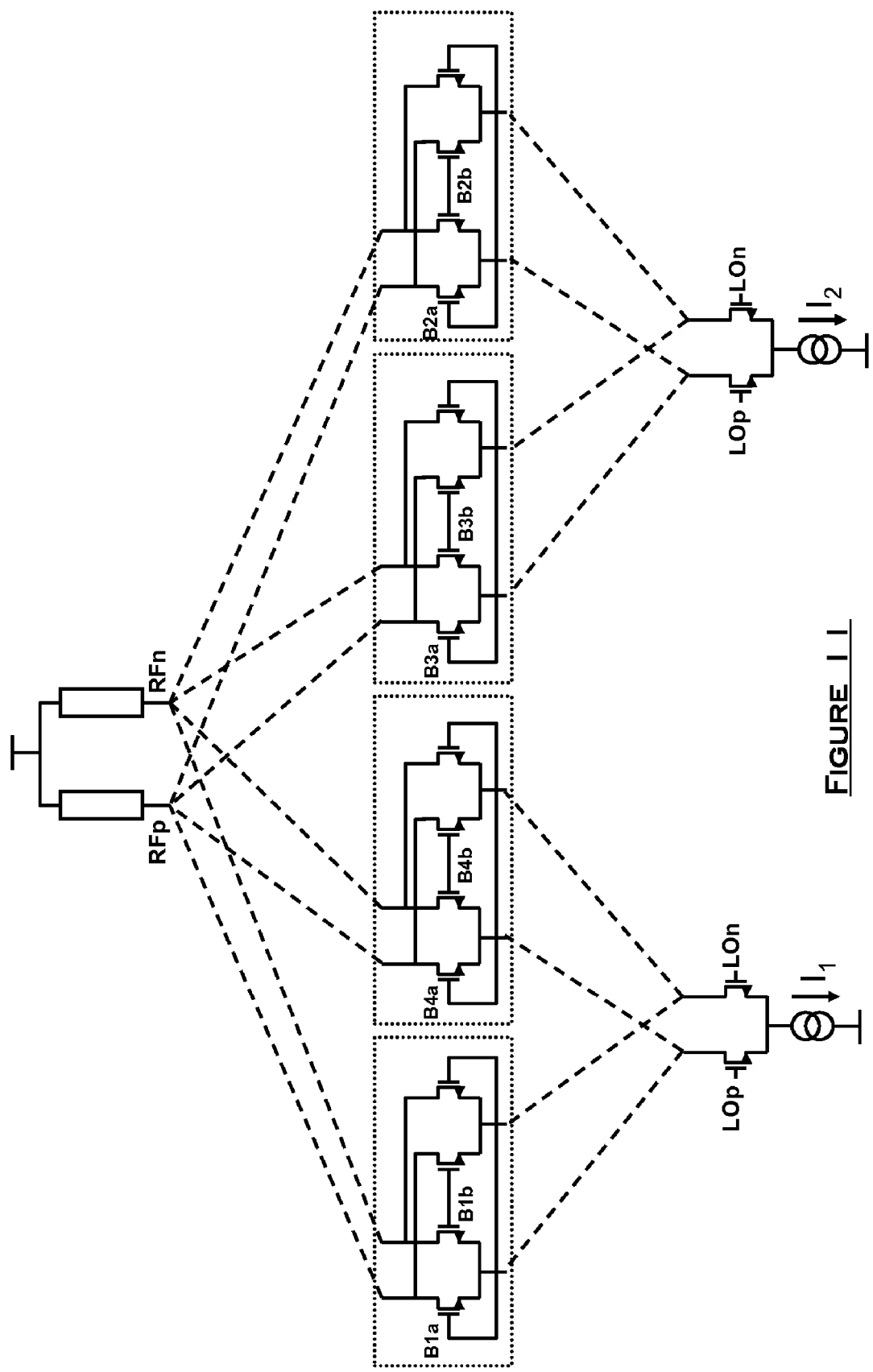
FIG. 11 shows a schematic of a modulator core.

The modulator core itself is an extension of a gilbert-type multiplier. The schematic diagram of the modulator is shown in FIG. 11. The tail of the modulator core is composed of two differential current sources where the current is modulated by the RF oscillator (LOp and LOn) and will provide the carrier of the signal. This current passes then through four units of cross-coupled switches that route the current to the positive load or the negative load depending on the value at the Bik inputs, where i=1:4 and k=a,b.

The circuit has three types of operations:
1. All Bik values are set to 0 and the structure is switched off;
2. All Bik values are set to 1 and the structure is switched on but no RF signal is present at the output; and
3. The Bia and Bib values are of opposite values and a differential RF current flows through the differential load.

In the case of the third operation, three different types of transitions can be achieved:
A. Transition from 0 to A and A to 0;
B. Transition from 0 to −A and −A to 0; and
C. Transition from A to −A and −A to A;

where A is the maximum signal amplitude. Transitions A and B are for the beginning and end of the burst sequence. Transition C is for the modulation by transitions itself. Transitions A and B are obtained from the state where all Bik values are set to 1 (type of operation number 2).

The units of cross-coupled switches are progressively switched on one by one from unit 1 to unit 4 to obtain the following transition:

$$\pm \frac{l_1}{2} \to \pm\left(\frac{l_1}{2}+\frac{l_2}{2}\right) \to \pm\left(\frac{l_1}{2}+l_2\right) \to \pm(l_1+l_2)$$

The transition follows either positive transitions or negative transitions depending on the first value in the code.

Transition C is achieved by inverting each of the units of cross-coupled switches one by one from unit 1 to unit 4 to obtain the following transitions:

$$\mp(l_1+l_2) \to \mp l_2/2 \to \pm l_2/2 \to \pm(l_1+l_2)$$

In this way, the transitions A and B are two times slower than transition C. This is to be expected since the first and last symbols are not overlapping with a preceding or following symbol respectively and feature the original triangular slope. Transition C occurs at twice the original triangle slope since it results from the overlap between two opposite and overlapping triangles (see FIG. 9).

Figure 12:
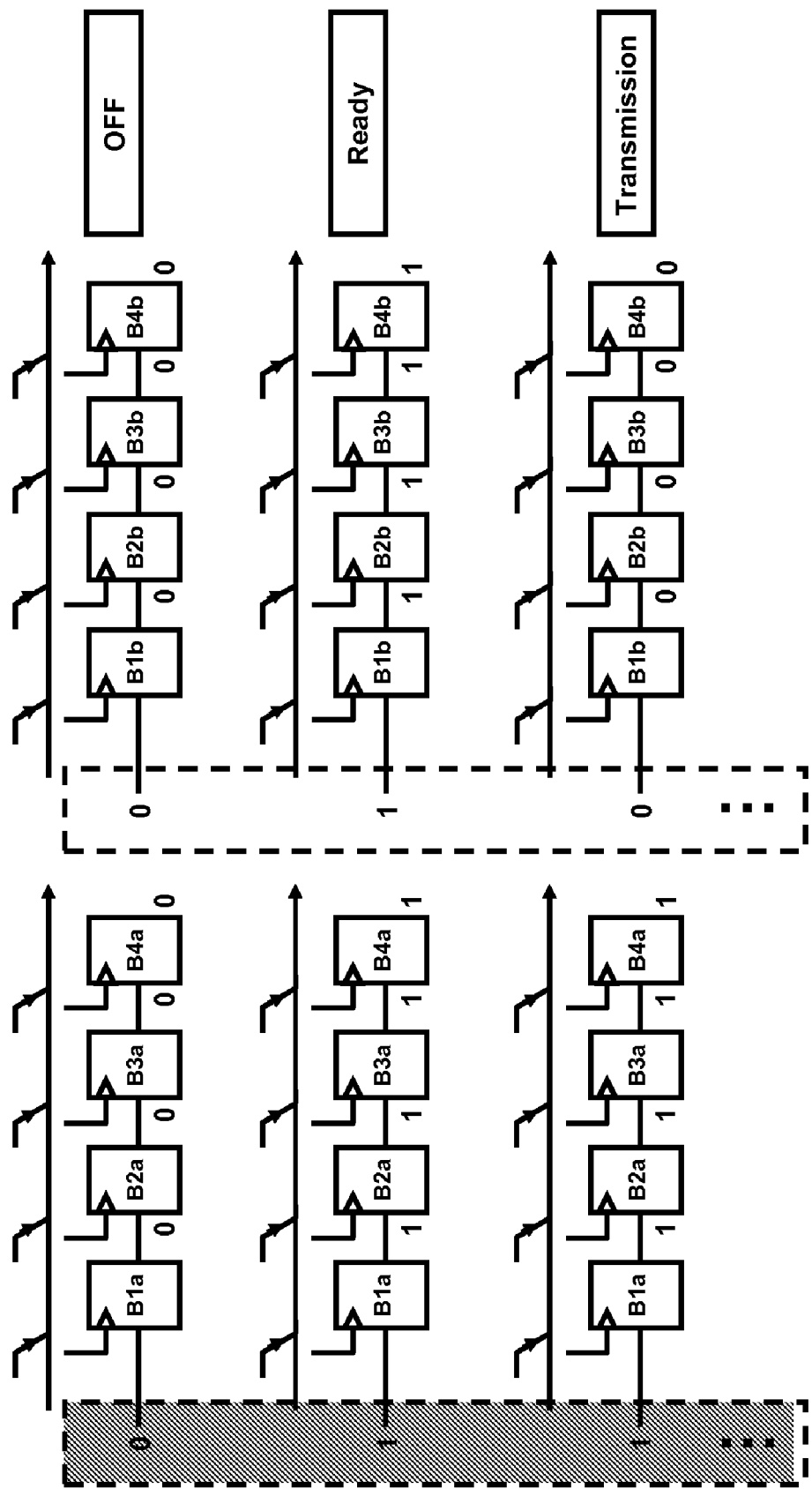
FIG. 12 shows a start-up sequence of a modulator, according to an example.

The Bik values are provided by two sets of four stages shift registers clocked by the four outputs from the divider, one for the Bia values and the other for the Bib values. Before applying the code sequence, all four registers are reset to zero. Then the value "1" is first applied to both registers such that by propagating along the shift registers, they will progressively start-up the modulator. The real code (opposite value at both inputs) can than be applied to start the burst. This sequence of operations is depicted in FIG. 12.

Figure 13:
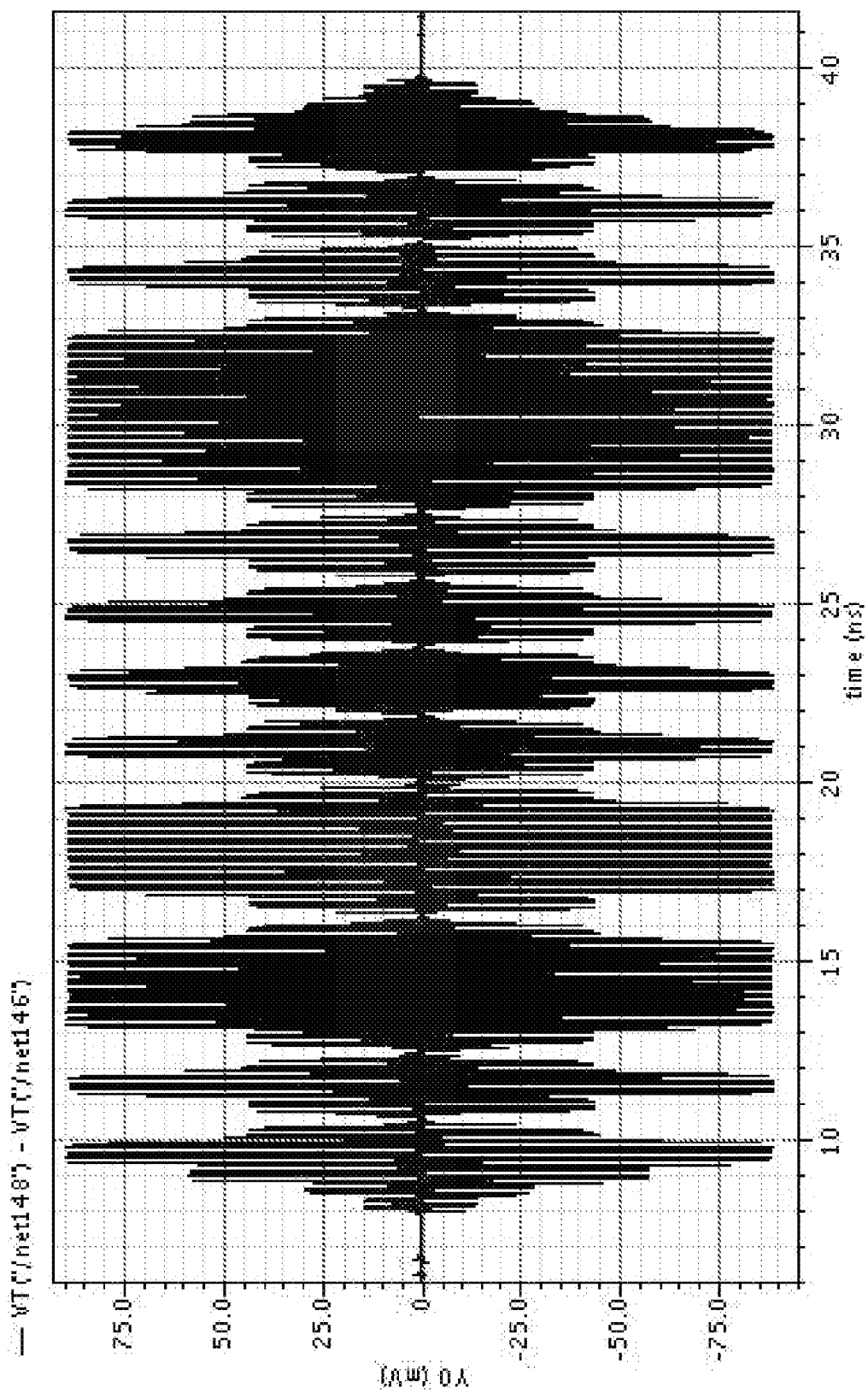
FIG. 13 shows a graph of a burst output of the modulator, according to an example.

A simulated output of the modulator is shown in FIG. 13. Such simulation can be realized with the cell "Total_simulation". The modulator feeds directly a 50 Ohm antenna. The output voltage is larger than 90 mV peak.

Figure 9:
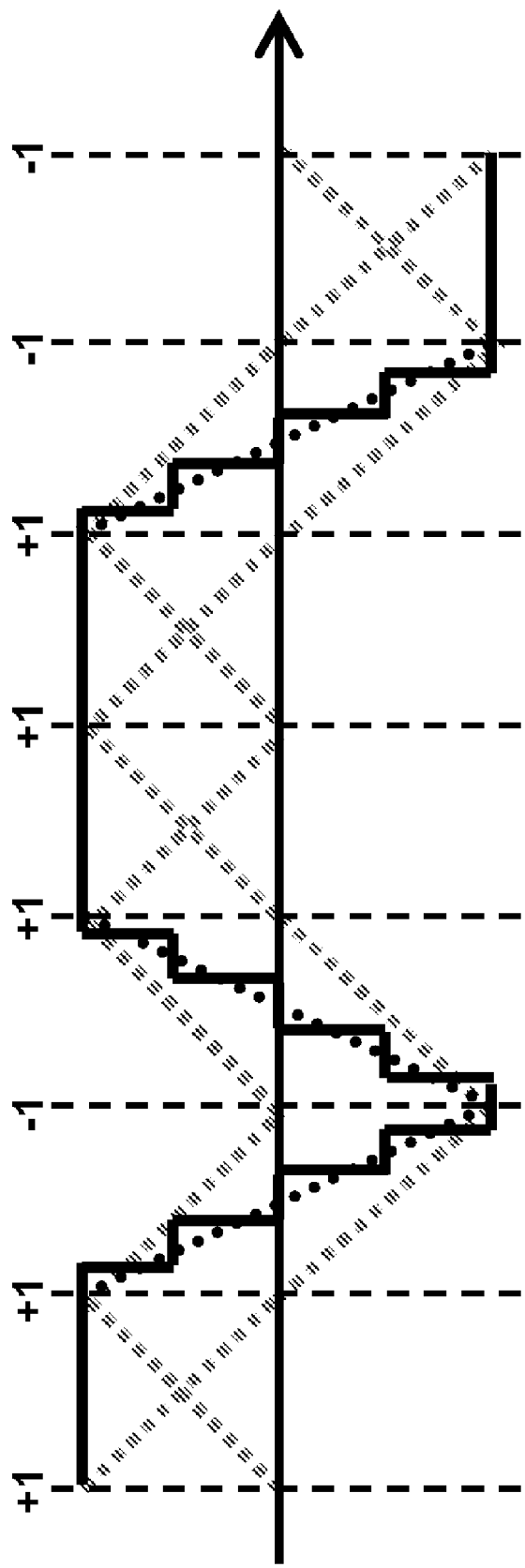
FIG. 9 shows a graph of a four-step inversion process.

To produce a burst of BPSK modulated chips, the RF LO must be modulated by a code sequence of +1 and −1 predefined by the standard for each piconet. The modulation operation is achieved by inverting and shaping the carrier at each code transition. A nice feature of the synchronous divider is the fact that the timing required to shape the pulses is available in the intermediate phases, as shown in FIG. 9. Four discrete steps are taken to invert the carrier by using four parallel multipliers that are consecutively activated by four properly chosen phases of the divider HTL chain. Each multiplier multiplies the RF LO with the code value (+1 −1).

Thereby, a code transition produces at the sum output an RF LO inversion in four discrete steps as a result of the sequential activation of the multipliers.

A alternative transmitter design is possible in a 90 nm UMC CMOS technology. This transmitter supports all low data rate modes that are defined in the standard. After extraction, all mandatory frequency bands are covered and the maximum output power as specified in the standard is achieved. At maximum output power, the power consumption of the transmitter is below 50 mW for a continuous transmission. This IC allows evaluation of duty-cycling of the transmitter in order to limit the average power consumption.

The building blocks of this design are the modulator, the timing generation circuit, and the digital controller. The IC is implemented in a mixed-signal 90 nm-CMOS technology of UMC. The analog blocks are powered on either a 1V or a 1.2V supply. The digital circuits are powered on 1V. The digital I/O has 2.5V supply.

The modulator performs the D/A conversion, the shaping of the pulses, the up-conversion to an RF-carrier and it provide the output power to an external 50 Ohm load. The modulator is capable of transmitting in all frequency bands from 3.5 GHz until 10 GHz. The frequency bands are on a grid of 499.2 MHz. The modulation in these frequency bands is defined in the IEEE 802.15.4a standard. Basically, a sequence of pulses is transmitted. The pulses have a repetition frequency of 499.2 MHz. Various pulse durations are defined in the standard. Table 1 gives an overview. The pulse duration in the mandatory modes is 2 ns (corresponding to a pulse bandwidth of 499.2 MHz). This is considered as the default operation. The presented modulator does support the other pulse durations (bandwidths). These optional pulses are referred to as the "short pulses". The pulse shape is defined in the standard.

TABLE 1

Pulse duration for the various bandwidths

| Bandwidth | Tpulse = 1/bandwidth |
|---|---|
| 499.2 MHz | 2 ns |
| 1081.6 MHz | 0.92 ns |
| 1331.2 MHz | 0.75 ns |
| 1354.97 MHz | 0.74 ns |

Figure 14:
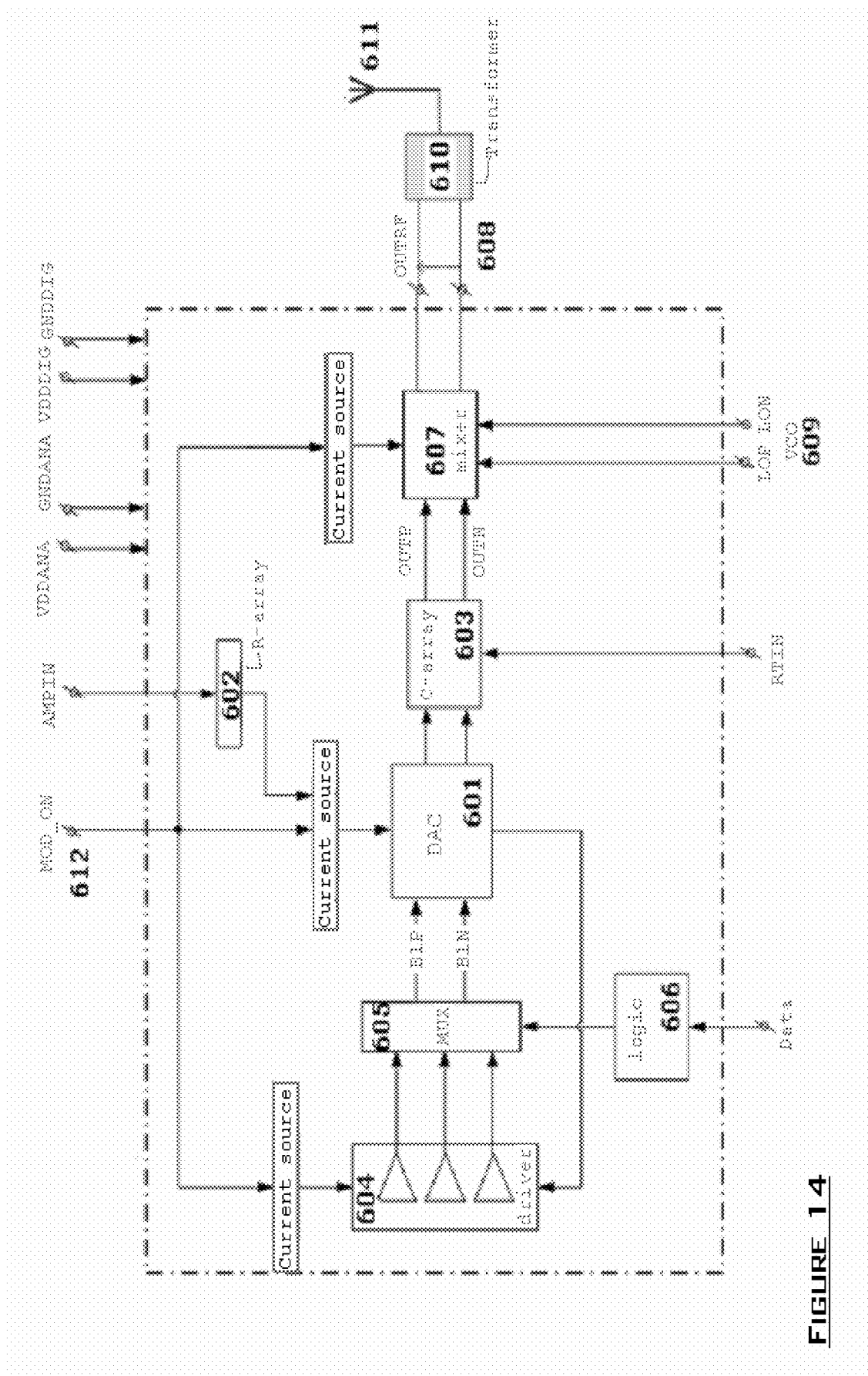
FIG. 14 shows a block diagram for a transmitter architecture of an embodiment.

The architecture of the transmitter is represented in FIG. 14. A 1-bit DAC (601) provides a baseband pulse of the correct sign and with the target shape. The amplitude of the pulse is tuned by the resistor array (602), while the slope of the pulse is determined by the capacitor array (603). The driver block (604), together with the multiplexer (605) and the digital logic (606), provides for non-overlapping data to drive the DAC. The sample frequency of the data equals the repetition frequency of the pulses, 499.2 MHz. The mixer (607) up-converts the pulse to the RF frequency (608). The RF-frequency, between 3.5 GHz and 10 GHz, is generated by a VCO (609). External to the IC, a balun (610) converts the differential output signal into a single-ended signal that is delivered to the 50 Ohm antenna load (611). All analog sub-blocks use a 1.2V power supply. The digital control signals are provided from a 1V supply domain and are level-shifted when applied to analog blocks. In order to decrease the average power consumption, all moments of inactivity are used to turn off the transmitter. Therefore, an enable pin called "MOD_ON" (612) is implemented. When "MOD_ON" is low, the transmitter is powered down.

The baseband part of the transmitter consists of the pulse shaper circuit and is formed by the driver (604), the multiplexer (605) and the 1-bit DAC (601). Essentially, this shaper circuit performs the D-to-A conversion and generates the envelope for the RF pulses.

Given the ternary encoding defined in the standard, the DAC (601) can be implemented. The DAC (601) is shown in detail in FIG. 15. It is called a "1-bit DAC" but, in fact, next to a "+1" and a "−1" output, a third output state that represents a "0" is available. The circuit is derived from the current-steering DAC of "N. Ghittori, A. Vigna, P. Malcovati, S. S'Amico, A. Baschirotto, '1.2V Low-Power Multi-Mode DAC+ Filter Blocks for reconfigurable (WLAN/UMTS, WLAN/Bluetooth) Transmitters', IEEE Solid State Circuits, vol. 41, no. 9, September 2006" which is hereby incorporated in its entirety and consists of a differential pair. The transistor pair M1-M2 (701, 702) is dimensioned such that the programmable current source remains in saturation in all modes (W=64 μm, L=90 nm). In view of speed, M1-M2 must operate in the active region. Therefore, the multiplexers (605) of FIG. 14, connecting to the driver circuit (604) of FIG. 16, must provide for a reduced signal swing at these gates. In fact, the "driver" is rather a reference circuit: it generates 3 reference voltages, Vhigh=0.81V, Vlow=0.58V and Vmid=0.5V. The signal B1P (703) is connected to Vhigh (801), Vlow (803) or Vmid (802), when the logic input is a 1, a −1 or a 0 respectively. The signal B1N (704) is then connected to Vlow (803), Vhigh (801) and Vmid (802), respectively. The value of these voltages is determined by the bias point of M1 and M2, on one hand. On the other hand, these voltages allow designing the pass-gates of the analog multiplexer around Vdd/2. Each branch of the driver conducts 200 μA.

Note that Vmid (802) is lower than the other voltages. This is done in order to obtain the most stable output amplitude, regardless of the code transition. For example, in case of a −1 to 1 transition, the voltage swing on both input transistors of the DAC (601) is maximal and opposite in sign. However, in case of, for example, a 0 to 1 transition, and supposing Vmid (802) would equal (Vhigh+Vlow)/2, then, the differential voltage swing would be smaller. As a consequence, the rise/fall time would be much larger and the maximum amplitude may not be achieved. In order to reduce this problem, Vmid (802) is chosen smaller than Vlow (803).

Figure 16:
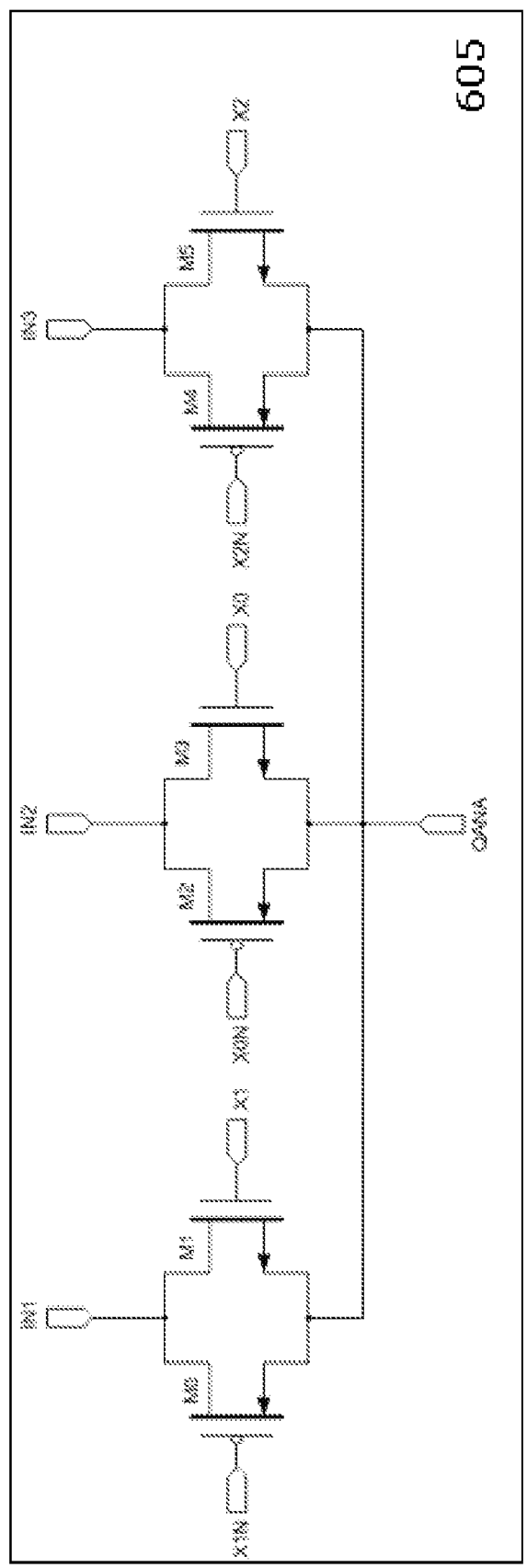
FIG. 16 shows a schematic of an analog multiplexer 3-to-1.

The MUX (605) is depicted in FIG. 16. For the NMOS, W/L=1 μm/90 nm; while the PMOS is 3 times larger in order to have a similar on-resistance. The combination of an NMOS and a PMOS transistor reduces the charge injection when switching because complementary charges are injected.

Next to the D/A conversion that is described above, the second function of the pulse shaper is in defining the envelope of the transmitted pulses. The pulse shaper defines the amplitude and the slope of the envelope. The amplitude of the pulses needs to be programmable and adapted to the number of pulses that are transmitted on average; i.e. the pulse amplitude depends on the transmission mode.

Figure 15:
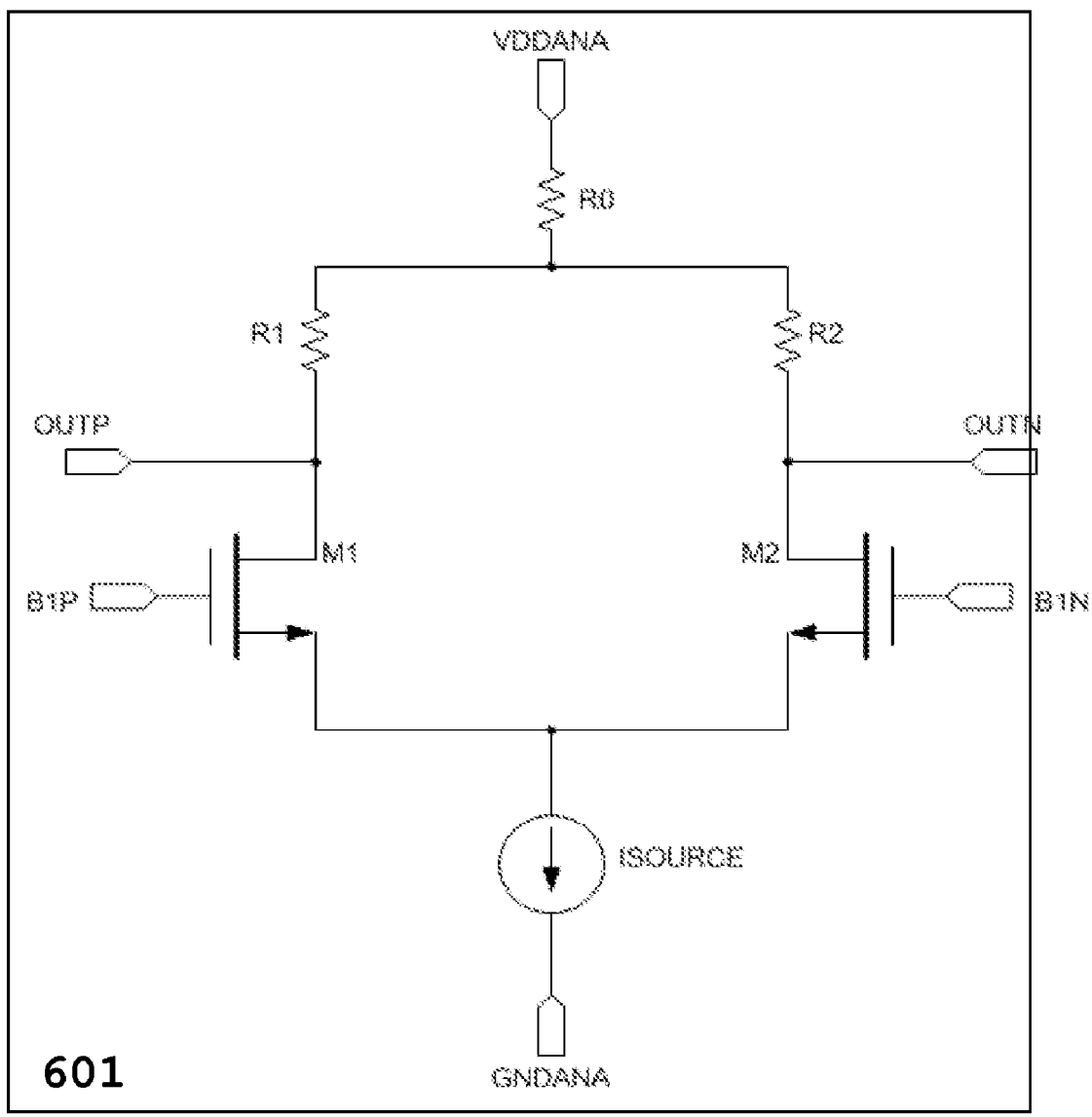
FIG. 15 shows a schematic of a 1-bit DAC.
Figure 17:
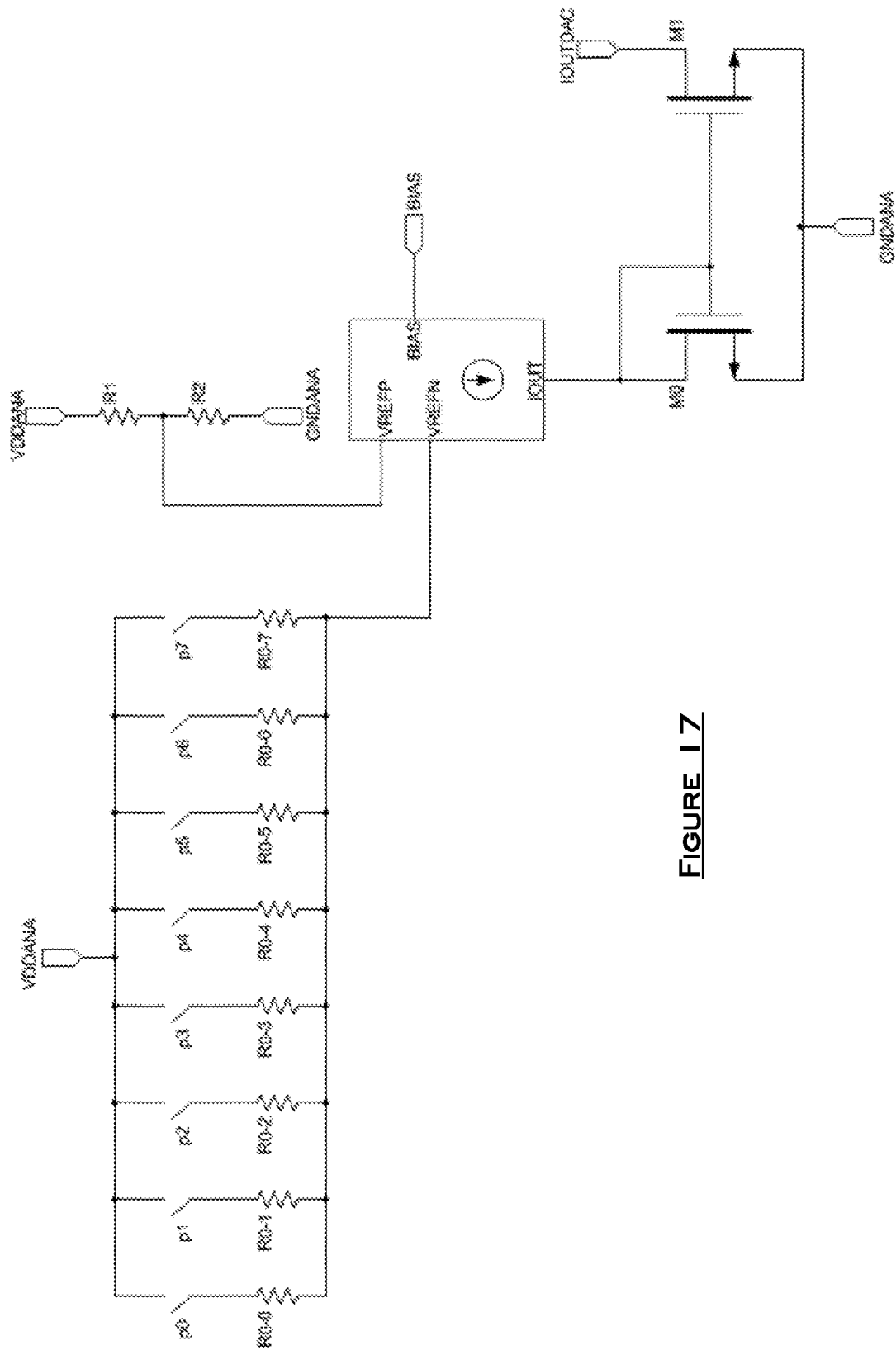
FIG. 17 shows a schematic of the programmable biasing circuit with resistor array.

In the DAC (601) of FIG. 15, the tail current source is programmable, such that, together with the value of the resistors R1=R2, it determines the amplitude of the baseband output signal. FIG. 17 shows the circuit that generates "Iout-DAC", being the tail current of the DAC in FIG. 15. The reference voltage VrefP $$VrefP = VddANA \frac{R1}{R1 + R2} \quad (1)$$

Is copied to node VrefN.

The programmable resistor array R0_0 through R0_7, converts this voltage into a current Iout. Transistor pair M0-M1 mirror this current into "IoutDAC", such that:

$$IoutDAC = VddANA \frac{R1}{R1 + R2} \frac{1}{R0\_i} \quad (2)$$

where R0_i represents the programmed value of the resistor array. Clearly, IoutDAC is programmable via R0_i. It can be programmed from 450 μA to 700 μA. Returning to the schematic of the DAC in FIG. 13, IoutDAC is the value of the tail current of this circuit. Together with resistors R1 and R2, it determines the amplitude of the output voltage. Hence, the output amplitude is accurately programmed by a ratio of resistances. The peak amplitude voltages are shown in Table 2. These are obtained using the short data sequence 0/+1/0/−1/+1/0 and checking the maximum amplitude for each setting on the resistors array. As it can be seen, the step is kept more or less constant around 50 mV and maximum amplitude of 418 mV is obtained.

TABLE 2

Overview of the programmable output swing of the DAC

| Switch on | Peak output voltage |
|---|---|
| p7 (111) | 418 mV |
| p6 (110) | 362 mV |
| p5 (101) | 298 mV |
| p4 (100) | 245 mV |
| p3 (011) | 193 mV |
| p2 (010) | 147 mV |
| p1 (001) | 100 mV |
| p0 (000) | 72 mV |

Following a similar analysis, it becomes clear that the output common mode voltage is also accurately determined by a ratio of resistances. The output common mode voltage equals:

$$Vout, CM = Vdd - (R0 + R1 \| R2) \cdot IoutDAC \quad (3)$$

where IoutDAC was defined in eq. (2) and depends on the programmed resistance. When a large resistance value is programmed, the output common mode voltage increases. Finally, note that all signals are referred to VddANA, such that all disturbances on the supply remain common-mode.

Next to the amplitude of the output signal of the DAC, also the slope of this trapezoidal signal needs to be programmed. Given the choice of a trapezoidal envelope, an RC-type of load is applied to the current-switching DAC. The resistive load is fixed (i.e. R1=R2=925 Ohm), but the capacitance C can be switched. On one hand, it consists of a fixed contribution of almost 400 fF, due to the load associated with the gate of the mixer. In addition, a programmable contribution of one or two times 300 fF can be added in order to limit the rise time of the trapezoid to 500 ps or 800 ps, respectively. If no capacitance is added, the simulated rise time is around 200 ps.

The RF-part of FIG. 14 consists only of a mixer (607). No separate power amplifier is needed. As such, the function of the mixer-modulator is twofold: a) it modulates the pulse envelope onto an RF carrier and b) it provides the correct output voltage to an external balun, feeding the 50 Ohm antenna.

Figure 18:
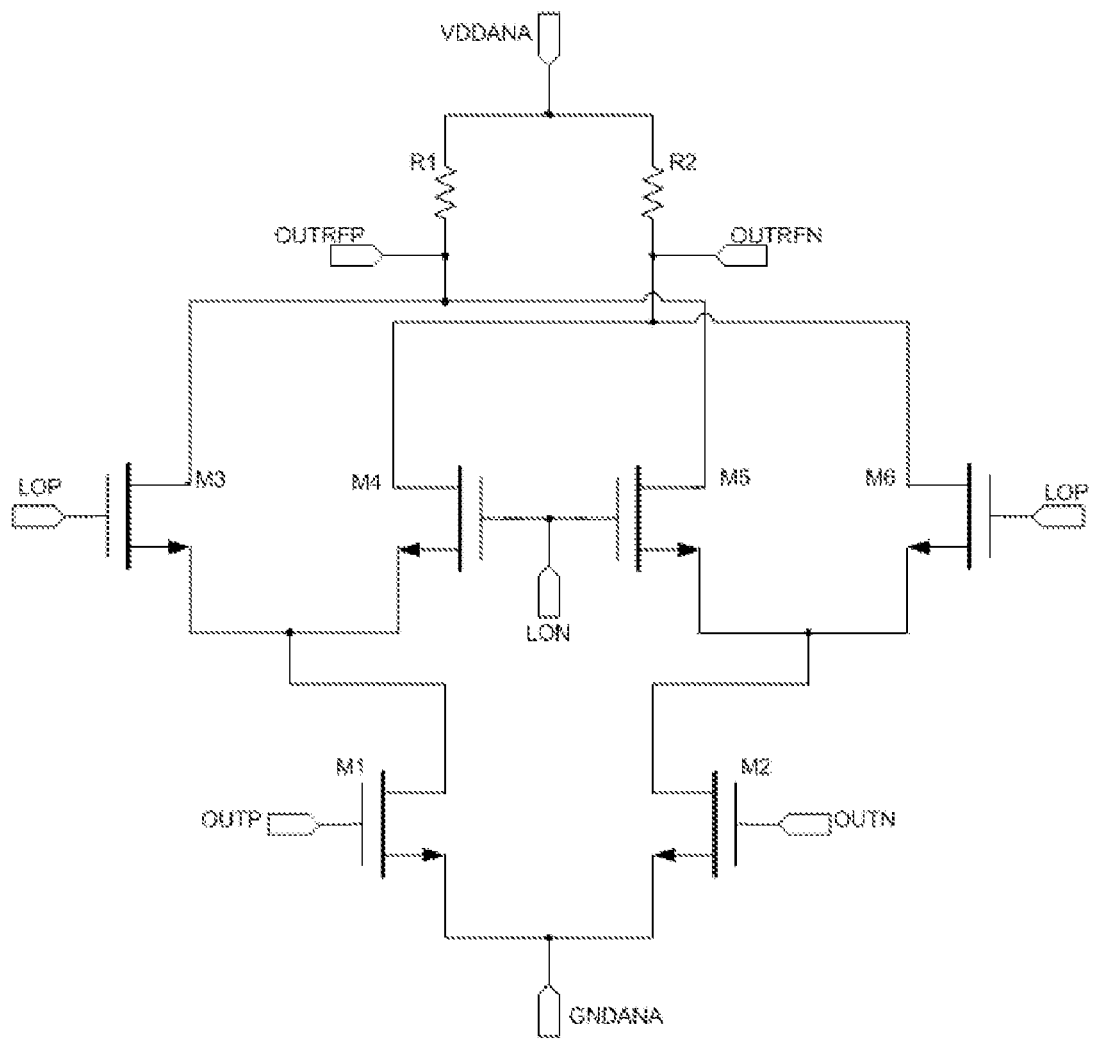
FIG. 18 shows a schematic of the pseudo-differential mixer.

The solution used here is a pseudo-differential mixer. The schematic is shown in FIG. 18. As compared to the double-balanced Gilbert cell, this circuit does not have a tail current source. As a consequence, a larger headroom, allowing a larger output amplitude, becomes available. In other words, only 2 transistors have to be stacked, instead of 3 in the Gilbert cell. Moreover, the transistors M1-M2 operate in weak-inversion and transistors M3-M6 operate as switches. As such, an output signal between 0.25V and 0.75V can be accommodated at both node outRFn and outRFp. This yields an amplitude of almost 0.45V for the differential output signal.

In this pseudo-differential mixer, the baseband pulse is applied to the gate of transistor M1 (or M2). The LO signal is applied to the switching differential pair M3-M4 (or M5-M6), up-converting the drain current of M1 (or M2). The gain of the mixer is determined by the lower stage gm and the load resistors R0 and R1. Transistors M1-M2 are reasonably large in order to provide a high gm. On the other hand, these big transistors introduce load capacitance for the DAC. The value of this load capacitance must be taken into account in the design of the capacitor array. The drain resistances R0 and R1 equal 50Ω. Hence, the output impedance of the mixer is matched to the off-chip balun, preventing reflections. As a consequence, the power is equally divided between the drain resistors of the mixer and the external load, causing a 3 dB power loss.

The LO-signal coming from the VCO, is AC-coupled to the gates of transistors M3-M6. As such, possible offsets are removed and the common mode level of the mixer LO input can be chosen freely. The coupling capacitance is a 1.77 pF MiM-capacitor. A resistive division of 4.8 kOhm and 10 kOhm defines the common mode input voltage for the mixer LO.

The mixer is at the heart of the transmitter. It performs both the up-conversion of the pulses to the RF-frequency and it provides a very a large output swing to the external load. As such, it is dominant in the power consumption of the entire transmitter. The large bias current of the mixer is reused as output current. An additional power amplifier is not needed. An alternative solution would consist of a low power mixer with larger drain resistors, followed by a separate power amplifier to drive the external load. Then, the power amplifier can be optimized orthogonal to the mixer optimization. However, considering the wide operational bandwidth up to 10 GHz, it can safely be assumed that the power consumption of the mixer remains significant and that the overall power consumption of the cascaded solution is higher that that of the presented solution.

Figure 19:
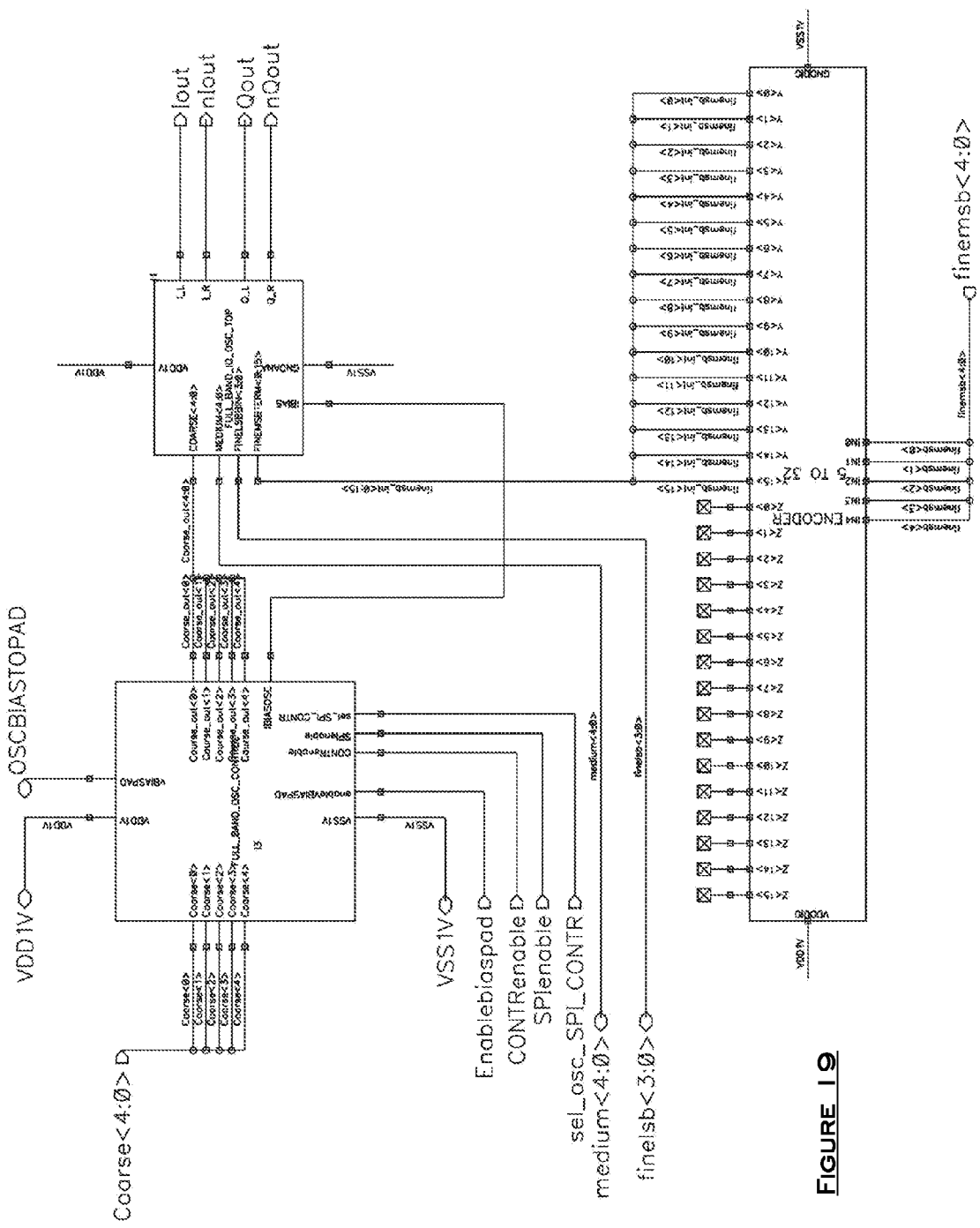
FIG. 19 shows an oscillator core.

The VCO has differential, quadrature outputs and is meant as a full-band oscillator. In schematic simulation, it can be tuned over the full band from 3.1 until 10.6 GHz. However, after layout, including the extracted parasitics, the maximum oscillation frequency is 8.5 GHz. Hence, the highest mandatory band is just included. At this frequency, the power consumption is maximum and is about 6.1 mW (operating from a 1V supply). At 1 MHz offset of the carrier, the phase noise is then −73.8 dBc/Hz. Its start-up time is around 1 ns. In FIG. 19 the oscillator core and two supporting blocks used for the final tape-out are shown. The description of the control signals can be found in Table 3.

TABLE 3

Description of the control signals

| Control signal Name | Description |
| --- | --- |
| coarse<4 : 0> | 5 coarse-tuning bits |
| medium<4 : 0> | 5 medium-tuning bits |
| finelsb<3 : 0> | low 4 bits of fine tuning |
| finemsb<4 : 0> | high 5 bits of fine tuning |
| Enablebiaspad | enable oscillator biased from external current source |
| sel_osc_SPI_CONTR | Select SPI or controller to enable oscillator; "1" = controller, "0" = SPI |
| CONTRenable | Enable oscillator by controller, "1" = enable, "0" = disable |
| SPIenable | Enable oscillator by SPI, "1" = enable, "0" = disable |

The MSB bits of the fine tune control are thermometer coded, hence one block converts this back into binary coding. The oscillator control block makes sure that the oscillator is properly powered down. In addition, it provides means to externally influence the voltage swing and frequency via the terminal "OSCBIASTOPAD".

This divider is the same as in FIG. 6 and is adapted to support the generation of "short pulses". It was mentioned that, for some transmission modes, a pulse-duration shorter than 2 nsec, needs to be generated. In fact, the short pulses are only specified in combination with a selected number of carriers. Table 4 gives an overview of the channels for which "short pulses" are defined in the standard. Note that, in all cases, the pulse duration is an integer multiple M of the carrier frequency period. The integer M is listed in the last column.

TABLE 4

Channels for which "short pulses" are defined in the standard

| Channel number | Carrier frequency | Pulse bandwidth | Pulse duration | M |
| --- | --- | --- | --- | --- |
| 4 | 3.9936 GHz | 1331.2 MHz | 751 ps | 3 |
| 7 | 6.4896 GHz | 1081.6 MHz | 925 ps | 9 |
| 11 | 7.9872 GHz | 1331.2 MHz | 751 ps | 9 |
| 15 | 9.4848 GHz | 1354.97 MHz | 738 ps | 7 |

Considering the operation principle of the RF divider, where each disabled HTL creates a delay of 1 RF cycle, the pulses are easily synthesized. One can simply take a logic combination of the output of 2 HTLs that are separated by M disabled cells. A modified EXOR is designed and its truth table is shown in Table 5. From its truth table in Table 5, it is clear that this is not a true EXOR since for the combination Edge1 Edge2=10 a logic 0 is outputted. This is enabled by the bottom, right-hand side NMOS transistor and solves the problem of the potential spike.

TABLE 5

Truth table of the circuit. of FIG. 23

| Edge1 | Edge2 | OUT |
| --- | --- | --- |
| 0 | 0 | 0 |
| 0 | 1 | 1 |
| 1 | 0 | 0 |
| 1 | 1 | 0 |

The programming of the HTLs must be such that the correct phases are available on the outputs, in all modes. As a consequence, the programming of the HTLs must be such that:

In case a divide by (20−N) must be realized, then N HTLs are enabled.
Then about N/2 enabled latches are in front of HTL8 in order to obtain a more or less symmetrical duty cycle for the clock to the digital controller.
In case "short-pulses" need to be transmitted, then, in between HTL5 and HTL12, exactly M latches are disabled. M is defined in Table 4.

Given these constraints, Table 6 is constructed giving an overview of the enabled bits for the case of transmission with "short pulses". In the transmission modes with default pulses of 2 ns duration, the choice of enabled HTLs is less constrained and therefore the multiple possibilities are not listed here.

TABLE 6

Programming of the HTLs for transmission modes with "short pulses"

| Channel number | Carrier frequency | Pulse bandwidth | Enabled HTLs |
| --- | --- | --- | --- |
| 4 | 3.9936 GHz | 1331.2 MHz | HTL 0, 1, 2, 4, 6, 7, 9, 10, 11, 13, 14, 16 |
| 7 | 6.4896 GHz | 1081.6 MHz | HTL 0, 1, 2, 6, 13, 14, 16 |
| 11 | 7.9872 GHz | 1331.2 MHz | HTL 2, 6, 14, 16 |
| 15 | 9.4848 GHz | 1354.97 MHz | HTL 14 |

A digital controller is integrated in order to generate pulse sequences in real-time. The digital controller can either produce a test sequence or a standard-compliant frame. In the latter case, a preamble (SYNC+SFD) modulated with isolated ternary pulses is followed by the header and payload modulated at the appropriate rate, potentially different from one another. An external master clock is provided. Its value corresponds to the Peak Preamble PRF and depending on the selected mode can take a value of 7.8 MHz, 31.2 MHz or 124.8 MHz. This clock needs to be available on a permanent basis. In addition, a 499.9 MHz clock is provided to the controller. This clock is used to generate UWB pulses that are aligned with the chip timing. It only needs to be available during transmission. Via a multiplexer, this clock can either be supplied from outside, or it can be taken from the output of the RF divider. The output signals from the controller, are 2 data bits (representing a ternary code) going to the data-formatting circuit that is part of the modulator. These data bits are also externally available for evaluation purposes. The controller consists of around 13.5 kgates. It occupies 440 μm×220 μm. Assuming a switching activity of 30% in all clock domains, the estimated power consumption remains below 1 mW over all process corners.

Figure 20:
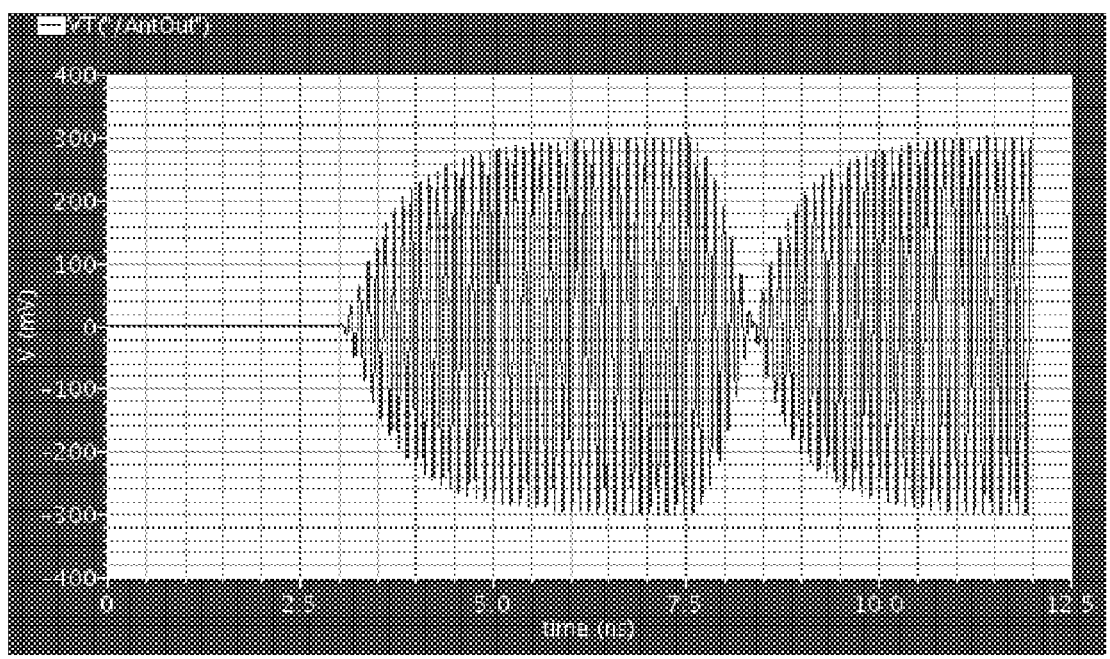
FIG. 20 shows a possible output sequence.
Figure 21:
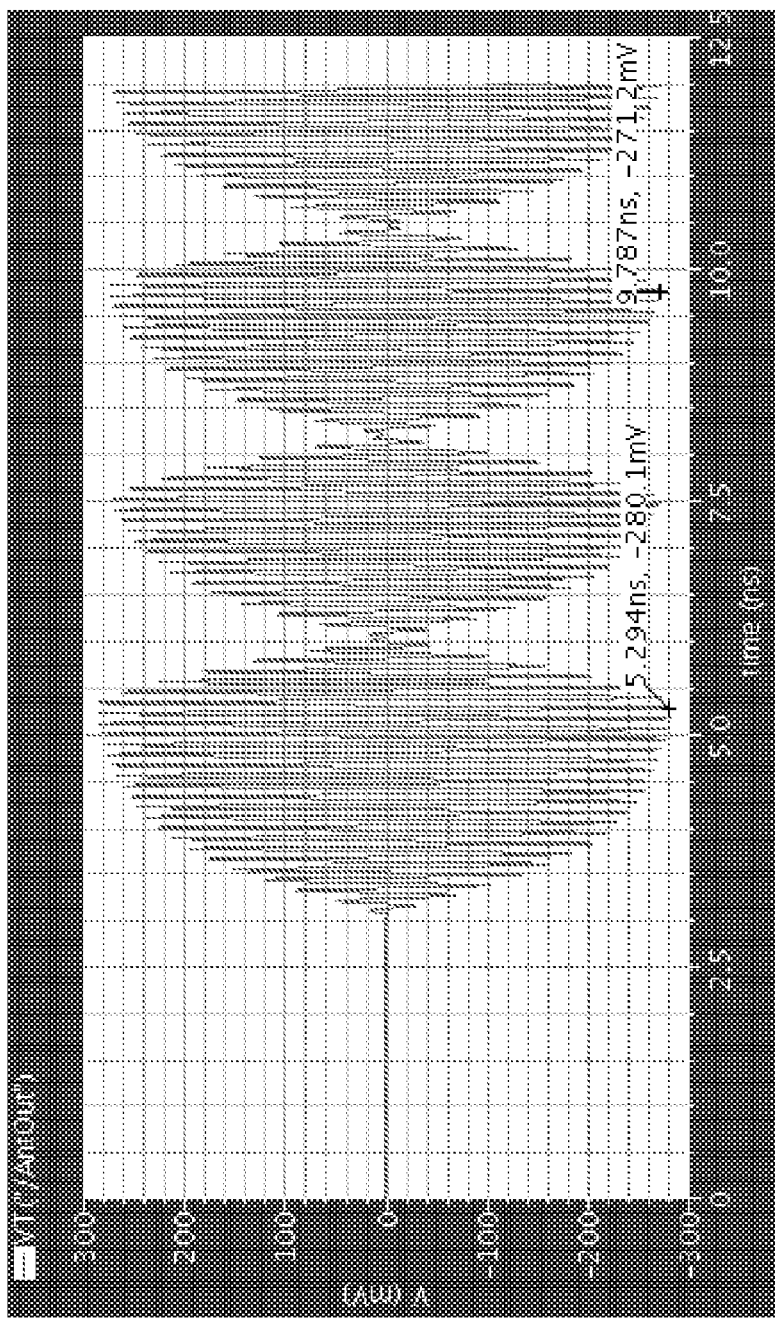
FIG. 21 shows a possible output sequence.

Some simulations were done on the complete transmitter. This was done on the schematic level, with all blocks included, except for the digital controller and the SPI interface. For the RF outputs, the load of the bondpads was modelled and added. FIG. 20 shows the differential output signal of the modulator in an external balun, when transmitting at 10 GHz. A data sequence of 3 consecutive "1"s followed by 3 consecutive "−1"s, is transmitted at the maximum output level. FIG. 21 shows the result for a sequence of alternating 1 −1 1 −1 data. In the latter case, the peak amplitude is slightly smaller, because the exponential settling is not finished within one pulse. This results in a slightly lower transmitted power but this is not at all critical.

Figure 22:
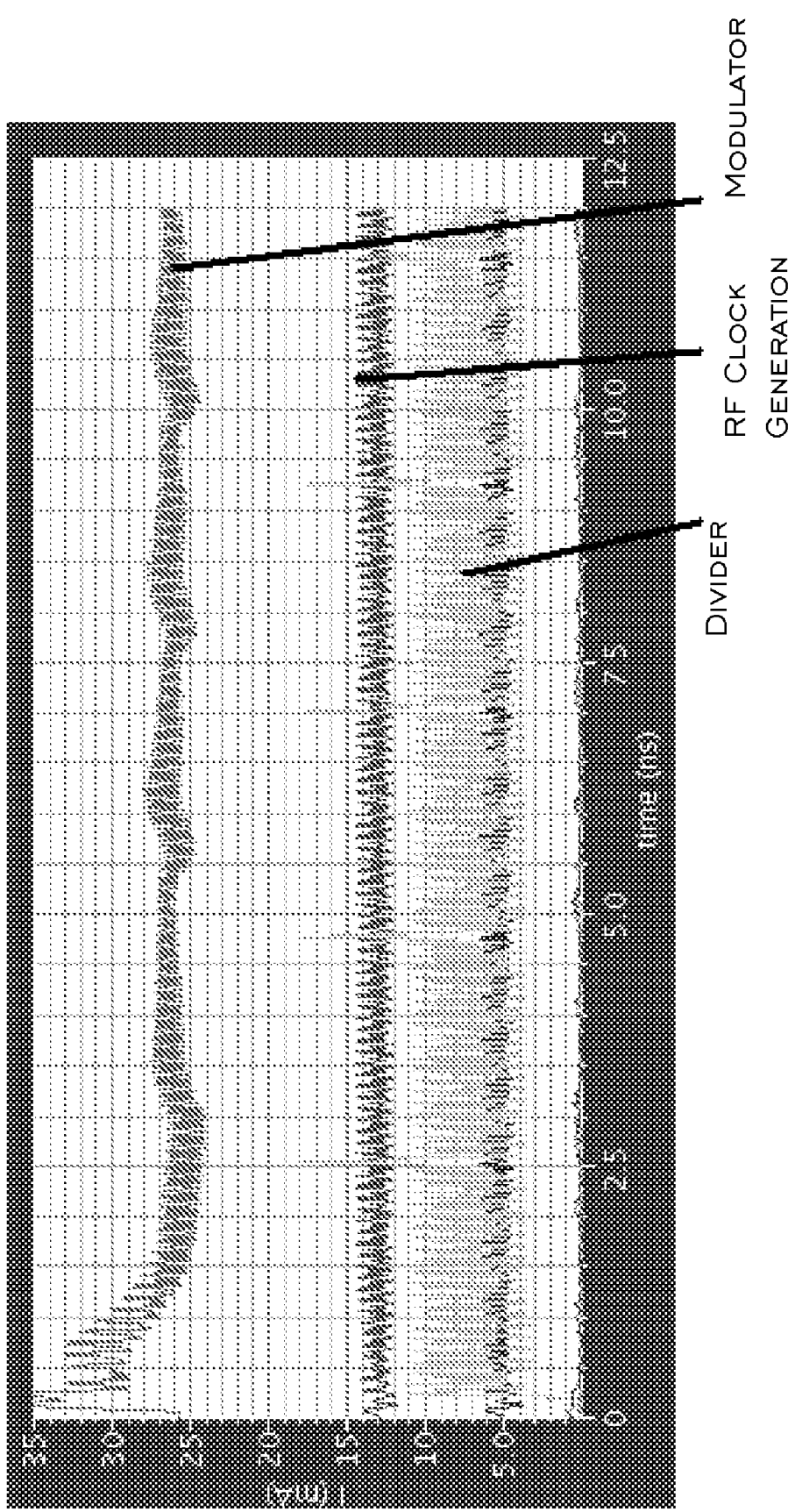
FIG. 22 shows a plot of the consumption of various sub-circuits when transmitting at 10 GHz.

FIG. 22 shows the current consumption of various sub-circuits of the transmitter in a transient simulation. Note the repetitive peak in the current consumption of the divider. This is the power associated with the reset of the cascade of latches, every 2 ns. Table 7 gives an overview of the power consumption of the dominant sub-block of the transmitter. The contributions in bold represent circuits that are essential for the transmitter. The other contributions are due to circuits needed for debug and evaluation. Obviously, the power consumption of the modulator is dominant given the large output amplitude that is delivered to the external 50 Ohm load. The power consumption of the transmitter increases for lower carrier frequencies. As a consequence, the power consumption at 10 GHz can be considered as an upper limit. Note that the table lists the power consumption in continuous operation. The average power consumption, when applying duty-cycling, can be much lower.

TABLE 7

Overview of power current consumption (power of core circuits is in bold, other circuits are for evaluation only)

| Circuit | Sub-block | at 10 GHz | At 6.5 GHz | At 3.5 GHz |
|---|---|---|---|---|
| Modulator | | 26 mA × 1.2 V | 27 mA × 1.2 V | 30 mA × 1.2 V |
| Clock generation | Total | 13 mA × 1 V | 11.2 mA × 1 V | 8.9 mA × 1 V |
| | Oscillator + tuning | 6 mA | 4.4 mA | 3.2 mA |
| | RF output buffer | 1.9 mA | 1.9 mA | 1.9 mA |
| | IQ buffers | 5.2 mA | 5.0 mA | 3.8 mA |
| RF divider | Total | 8 mA × 1 V | 5.5 mA × 1 V | 3.5 mA × 1 V |
| | Divider core | 0.6 mA | 0.6 mA | 0.6 mA |
| | Local LO buffer | 7.3 mA | 4.9 mA | 3.5 mA |
| 500 MHz buffers | | 2 × 3.4 mA × 1.2 V | 2 × 3.4 mA × 1.2 V | 2 × 3.4 mA × 1.2 V |
| Total P Tx-core | | 50.5 mW | 47.3 mW | 46.5 mW |

Although the invention has been described by reference to the foregoing embodiments, those embodiments should be viewed only as examples; the scope of the invention is not limited only to those examples. Instead, the scope of the invention should be measured by reference to the following claims.

The invention claimed is:

1. A device for generating an ultra-wide bandwidth transmission signal, said device comprising:
a digitally controlled variable oscillator for generating a plurality of oscillating portions;
circuitry for switching on and switching off said variable oscillator at the beginning and end, respectively, of each oscillating portion, wherein said switching circuitry comprises an enable node of said variable oscillator;
circuitry for setting initial conditions in said variable oscillator to impose a predefined transient and a characterizing frequency upon each start-up, wherein said initial condition setting circuitry comprises voltage nodes in between at least two cascaded stages of said variable oscillator, and wherein said initial condition setting circuitry comprises switches between ground and supply voltage on said voltage nodes;

feedback circuitry to said variable oscillator for monitoring said characterizing frequency of said oscillating portions, wherein said feedback circuitry comprises detection circuitry for comparing said characterizing frequency after each oscillating portion to that of a reference and for inputting a result indicative of said comparison into storage circuitry associated with said variable oscillator; and
a controller associated with said variable oscillator for updating said characterizing frequency for the next oscillating portion on the basis of said result.

2. A device according to claim 1 further comprising dividing circuitry for dividing the frequency of said oscillating portions at least once to generate a divided frequency roughly matching a preset frequency.

3. A device according to claim 2 wherein said detection circuitry is provided for comparing said divided frequency to that of a reference and for inputting a result indicative of said comparison into said storage circuitry.

4. A device according to claim 1, wherein the digitally controlled oscillator is a ring oscillator.

5. An ultra-wide bandwidth telecommunications device comprising said device according to claim 4.

6. A telecommunications device according to claim 5 wherein said telecommunications device is an ultra-wide bandwidth transmitter.

7. A telecommunications device according to claim 5 wherein said telecommunications device is an ultra-wide bandwidth receiver.

8. A telecommunications device according to claim 5 wherein said telecommunications device is an ultra-wide bandwidth transceiver.

9. A device according to claim 5, further comprising dividing circuitry for dividing the frequency of said oscillating portions at least once to generate a divided frequency roughly matching a preset frequency, and a modulator producing a BPSK modulated signal on the basis of said intermitted oscillating signal in discrete phases, said phases being provided by said dividing circuitry.

10. A device according to claim 4, wherein the digitally controlled oscillator further comprises:
a current mirror biased by a variable current source and by a variable degeneration resistance, wherein the current mirror supplies current to at least one stage of the ring oscillator; and
a variable capacitor bank between at least one pair of stages of the ring oscillator.

11. A device according to claim 4, wherein the digitally controlled oscillator is tunable over a frequency range of about 3 to 10 GHz.

12. A device according to claim 1, wherein said voltage nodes switched between ground and supply voltage are provided between all of the cascaded stages of said variable oscillator.

13. A method for generating an ultra-wide bandwidth transmission signal, comprising generating an intermitted oscillating signal comprising a plurality of oscillating portions separated from each other in time, the method comprising the steps of:
a) switching on a digitally controlled variable oscillator at the beginning of each of said oscillating portions by operating an enabling node,
b) upon staff-up, imposing initial conditions determining a predefined transient and a characterizing frequency on said variable oscillator by operating voltage nodes between at least two cascaded stages of the variable oscillator at a predefined state and releasing them at a reference clock edge;

c) switching off said variable oscillator at the end of each of said oscillating portions by means of the enabling node; and d) monitoring the characterizing frequency of said oscillating portions by operating a feedback circuitry, said monitoring comprising:

comparing said characterizing frequency after each oscillating portion to that of a reference inputting a result indicative of said comparison into said storage circuitry, and updating said characterizing frequency for the next oscillating portion on the basis of said result.

14. A method according to claim 13 wherein operating the voltage nodes comprises switching said nodes between ground and supply voltage.

15. A method according to claim 13, further comprising the step of dividing the frequency of said oscillating portions at least once to a frequency roughly matching a preset frequency.

16. A method according to claim 15, further comprising the step of modulating said intermitted oscillating signal to a BPSK modulated signal in discrete phases, said phases being provided by said step of dividing.

17. A method according to claim 13 wherein the predefined transient includes a predefined phase.

* * * * *